United States Patent
Sengoku

(10) Patent No.: US 9,678,828 B2
(45) Date of Patent: Jun. 13, 2017

(54) ERROR DETECTION CAPABILITY OVER CCIE PROTOCOL

(71) Applicant: QUALCOMM Incorporated, San Diego, CA (US)

(72) Inventor: Shoichiro Sengoku, San Diego, CA (US)

(73) Assignee: QUAULCOMM Incorporated, San Diego, CA (US)

( * ) Notice: Subject to any disclaimer, the term of this patent is extended or adjusted under 35 U.S.C. 154(b) by 304 days.

(21) Appl. No.: 14/511,160

(22) Filed: Oct. 9, 2014

(65) Prior Publication Data

US 2015/0100862 A1  Apr. 9, 2015

Related U.S. Application Data

(60) Provisional application No. 61/889,030, filed on Oct. 9, 2013, provisional application No. 61/946,647, filed on Feb. 28, 2014.

(51) Int. Cl.
*G06F 11/10* (2006.01)
*G06F 13/42* (2006.01)
*H03M 13/09* (2006.01)

(52) U.S. Cl.
CPC ...... *G06F 11/1004* (2013.01); *G06F 13/4221* (2013.01); *H03M 13/096* (2013.01)

(58) Field of Classification Search
CPC .................................................. G06F 11/1004
See application file for complete search history.

(56) References Cited

U.S. PATENT DOCUMENTS 3,629,823 A * 12/1971 Czernikowski ......... H04L 25/49
   341/57
4,546,351 A   10/1985 Nambu
4,697,265 A *  9/1987 Nozue ........................ H04L 1/24
   375/224
4,800,564 A *  1/1989 DeFazio ..................... G06F 1/10
   714/814

(Continued)

FOREIGN PATENT DOCUMENTS

DE    10250616 C1   11/2003
EP    0192944 A2    9/1986

(Continued)

OTHER PUBLICATIONS

Shanley T., et al., "PCI System Architecture—Edition 4th, Chapter 5 (106-119) and 14part (291-297)" In: May 31, 1999 (May 31, 1999), Addison-Wesley, XP055145686, the whole document.

(Continued)

*Primary Examiner* — Steve Nguyen
(74) *Attorney, Agent, or Firm* — Loza & Loza LLP

(57) ABSTRACT

A device is provided comprising a shared bus, a slave device, and a master device. The slave device may be coupled to the shared bus. The master device may be coupled to the control data bus and adapted to manage communications on the shared bus. Transmissions over the shared bus are a plurality of bits that are encoded into ternary numbers which are then transcoded into symbols for transmission, and either the 3 least significant bits or the least significant in the plurality of bits are used for error detection of the transmission.

24 Claims, 38 Drawing Sheets

(56) References Cited

U.S. PATENT DOCUMENTS

| | | | |
|---|---|---|---|
| 5,257,270 A * | 10/1993 | Hilden | H03M 5/145 341/59 |
| 5,274,647 A * | 12/1993 | Tanaka | G06F 5/10 714/48 |
| 5,321,818 A | 6/1994 | Wendling et al. | |
| 5,581,770 A | 12/1996 | Suzuki | |
| 5,613,128 A | 3/1997 | Nizar et al. | |
| 5,687,356 A | 11/1997 | Basso et al. | |
| 5,787,263 A | 7/1998 | Tamagawa et al. | |
| 5,818,362 A * | 10/1998 | Walker | H04L 25/4925 341/57 |
| 5,872,519 A | 2/1999 | Issa et al. | |
| 6,147,963 A * | 11/2000 | Walker | H03M 5/16 370/200 |
| 6,191,632 B1 | 2/2001 | Iwata et al. | |
| 6,195,764 B1 * | 2/2001 | Caldara | G06T 9/005 703/13 |
| 6,253,268 B1 | 6/2001 | Bjorkengren et al. | |
| 6,359,951 B1 * | 3/2002 | Morriss | G06F 13/385 326/86 |
| 6,370,668 B1 | 4/2002 | Garrett, Jr. et al. | |
| 6,532,506 B1 | 3/2003 | Dunstan et al. | |
| 6,609,167 B1 | 8/2003 | Bastiani et al. | |
| 6,617,985 B1 * | 9/2003 | Poeppelman | H03M 5/145 341/58 |
| 6,812,824 B1 | 11/2004 | Goldinger et al. | |
| 6,839,393 B1 | 1/2005 | Sidiropoulos | |
| 6,895,057 B1 * | 5/2005 | Balachandran | H04L 1/0003 370/465 |
| 7,089,338 B1 | 8/2006 | Wooten et al. | |
| 7,707,349 B1 | 4/2010 | Keithley | |
| 7,984,214 B2 | 7/2011 | Heizmann | |
| 8,103,803 B2 | 1/2012 | Reddy et al. | |
| 8,103,896 B2 | 1/2012 | Deshpande | |
| 8,112,551 B2 | 2/2012 | Sullam | |
| 8,411,168 B2 | 4/2013 | Oka | |
| 8,549,198 B2 | 10/2013 | Cohen et al. | |
| 8,629,913 B2 | 1/2014 | Cote et al. | |
| 8,971,469 B2 | 3/2015 | Imai et al. | |
| 9,007,336 B2 | 4/2015 | Shepelev et al. | |
| 2001/0017594 A1 * | 8/2001 | Ahn | G11B 20/14 341/59 |
| 2002/0024422 A1 | 2/2002 | Turner et al. | |
| 2004/0015752 A1 * | 1/2004 | Patella | G06F 11/1064 714/718 |
| 2005/0216815 A1 * | 9/2005 | Novotny | H04N 19/46 714/758 |
| 2005/0233789 A1 | 10/2005 | Maekawa | |
| 2007/0016694 A1 | 1/2007 | Achler | |
| 2007/0088874 A1 | 4/2007 | Brabant | |
| 2007/0234136 A1 * | 10/2007 | Leef | H04L 1/0061 714/704 |
| 2007/0297438 A1 | 12/2007 | Meylan et al. | |
| 2008/0005428 A1 * | 1/2008 | Maul | G06F 13/426 710/62 |
| 2008/0244370 A1 * | 10/2008 | Lam | G06F 11/1072 714/803 |
| 2009/0315899 A1 | 12/2009 | Pourbigharaz et al. | |
| 2009/0316724 A1 | 12/2009 | Muukki et al. | |
| 2011/0084900 A1 | 4/2011 | Jacobsen et al. | |
| 2011/0111700 A1 | 5/2011 | Hackett | |
| 2012/0117287 A1 | 5/2012 | Kashima | |
| 2012/0137022 A1 * | 5/2012 | Cala' | G06F 13/4291 710/3 |
| 2012/0259992 A1 | 10/2012 | Koehler et al. | |
| 2013/0018979 A1 | 1/2013 | Cohen et al. | |
| 2013/0039443 A1 | 2/2013 | Garaschenko et al. | |
| 2013/0305119 A1 * | 11/2013 | Kern | H03M 13/13 714/763 |
| 2014/0013017 A1 | 1/2014 | Decesaris et al. | |
| 2014/0025999 A1 | 1/2014 | Kessler | |
| 2014/0286466 A1 | 9/2014 | Sengoku et al. | |
| 2015/0030112 A1 | 1/2015 | Wiley et al. | |
| 2015/0046616 A1 | 2/2015 | Pedersen et al. | |
| 2015/0074305 A1 | 3/2015 | Sengoku et al. | |
| 2015/0095537 A1 | 4/2015 | Sengoku | |
| 2015/0100713 A1 | 4/2015 | Sengoku | |
| 2015/0199287 A1 | 7/2015 | Sengoku | |
| 2015/0199295 A1 | 7/2015 | Sengoku | |
| 2015/0248373 A1 | 9/2015 | Sengoku | |
| 2016/0147684 A1 | 5/2016 | Sengoku | |
| 2016/0217090 A1 | 7/2016 | Sengoku et al. | |
| 2016/0364353 A1 | 12/2016 | Sengoku | |

FOREIGN PATENT DOCUMENTS

| | | |
|---|---|---|
| EP | 0588191 A1 | 3/1994 |
| GB | 2173929 A | 10/1986 |
| WO | WO-0042740 A1 | 7/2000 |
| WO | WO-2013052886 A2 | 4/2013 |

OTHER PUBLICATIONS

I-An Chen et al: "An error-correction scheme with Reed-Solomon codec for CAN bus transmission", Intelligent Signal Processing and Communications Systems (ISPACS), 2011 International Symposium on, IEEE, Dec. 7, 2011, pp. 1-5, XP032114635, DOI: 10.1109/ISPACS.2011.6146059 ISBN: 978-1-4577-2165.

International Search Report and Written Opinion—PCT/US2014/059981—ISA/EPO—Mar. 19, 2015.

"Tradeoffs when considering SPI or I2C?", internet article, Apr. 1, 2012 , XP002735900, Retrieved from the Internet: URL: http://electronics.stackexchange.com/questions/29037/tradeoffs-when-considering-spi-or-i2c [retrieved on Feb. 12, 2015].

Corrigan S: "Introduction to the Controller Area Network (CAN)—Application ReportSLOA101AAug. 2002, Revised Jul. 2008", internet article, Jul. 30, 2008 (Jul. 30, 2008), XP002740955, texas Instruments Retrieved from the Internet: URL: http://www.ti.com/lit/an/sloa101a/sloa101a.pdf [retrieved on Jun. 16, 2015] the whole document paragraph [3.1.1].

"I2C—Inter-IC Corrununications, Lectures 28, Oct. 26-29, 2012", internet article, Oct. 29, 2012 (Oct. 29, 2012), XP002740959, Retrieved from the Internet: URL: http://ece.uidaho.edu/ee/classes/ECE340/LectureNotes/L27/I2C.pdf [retrieved on Jun. 16, 2015] the whole document p. 2.

* cited by examiner

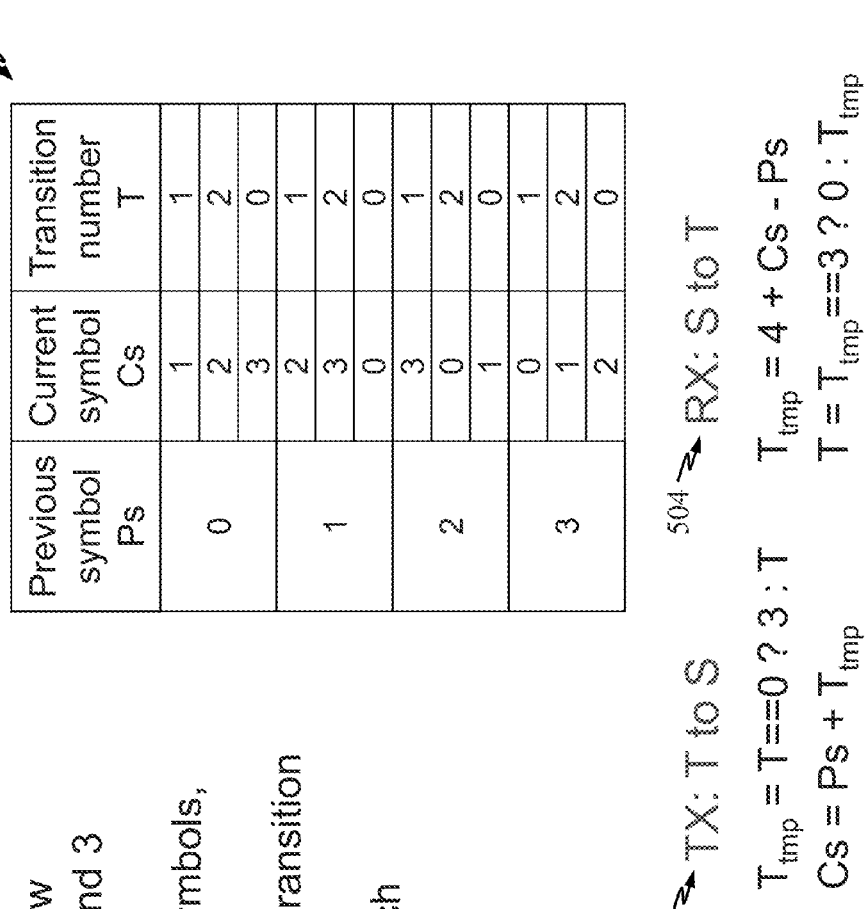
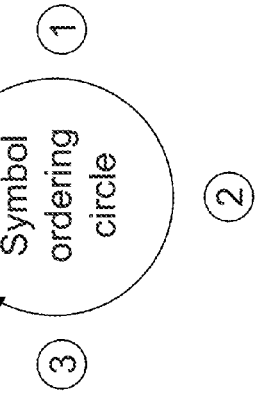
FIG. 5

CCIe Bit19 mapping

| Ternary | Bits[19:0] | Address | Write | Read | 19 | 12 | 11 | 9 | 8 | Bits[i] 7 | 6 | 5 | 4 | 3 |
|---|---|---|---|---|---|---|---|---|---|---|---|---|---|---|
| 2222_2222_2222₃ 0x31 (49) ↕ 0x81BF0 | | See FIG. 21 | | | 1 | 1 | 1 | 1 | 1 | 1 | 1 | ? | ? | ? |
| 2222_2222_1012₃ 0x81BC0 | | | | | | | | | | | | | | |
| 2222_2222_1011₃ 0x81BBF [6-bits] 0x40 (64) ↕ 2222_2221_1211₃ 0x81B80 | | | | | 1 | 1 | 1 | 1 | 1 | 1 | 0 | x | x | x |
| 2222_2221_1210₃ 0x81B7F [7-bit] 0x80 (128) ↕ 2222_2220_0002₃ 0x81B00 | | Master handover | | Reserved | 1 | 1 | 1 | 1 | 1 | 0 | x | x | x | x |
| 2222_2220_0001₃ 0x81AFF [8-bits] 0x100 (256) ↕ 2222_2202_2121₃ 0x81A00 | | Reserved | | Reserved | 1 | 1 | 1 | 1 | 0 | x | x | x | x | x |
| 2222_2202_2120₃ 0x819FF [9-bits] 0x200 (512) ↕ 2222_2112_1122₃ 0x81800 | | Reserved | Slave to slave grant | Slave to slave request | 1 | 1 | 1 | 0 | x | x | x | x | x | x |
| 2222_2112_1121₃ 0x817FF [11-bits] 0x800 (2048) ↕ 2222_1121_0210₃ 0x81000 | | CCIe register address | | Master bus request | 1 | 1 | 0 | x | x | x | x | x | x | x |
| 2222_1121_0202₃ 0x80FFF [12-bits] 0x1000 (4096) ↕ 2222_2201_2002₃ 0x80000 | | 8-bit CHK | 8-bit CHK | 8-bit CHK | 1 | 0 | x | x | x | x | x | x | x | x |
| 2221_2201_2001₃ 0x7FFFF 0x80000 (524288) ↕ 0000_0000_0000₃ 0x00000 | | 19-bit data region | | | 0 | x | x | x | x | x | x | x | x | x |

Bit[19] = 1

*FIG. 20*

CCIe Bit19 mapping cont.

| Ternary | Bits[19:0] | Address | Write | Read | 19 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| 2222_2222_2222₃ | 0x81BF0 | /SY- | | Prohibited | 1 | 1 | 1 | 1 | 1 | 1 | 1 | 1 | 1 | 1 | 0 | 0 | 0 | 0 |
| 2222_2222_2221₃ | 0x81BEF | | Prohibited | | | | | | | | | | | | | | | |
| 0x2A (42) ↕ | | | | | | | | | | | | | | | | | | |
| 2222_2222_1102₃ | 0x81BC6 | | | | 1 | 1 | 1 | 1 | 1 | 1 | 1 | 1 | 0 | 0 | 0 | 1 | 1 | 0 |
| 2222_2222_1101₃ | 0x81BC5 | Heartbeat w/-NC₀ | | Prohibited | | | | | | | | | | | | | | |
| 2222_2222_1100₃ | 0x81BC4 | | Prohibited | | | | | | | | | | | | | | | |
| 0x2A (42) ↕ | | | | | | | | | | | | | | | | | | |
| 2222_2222_1000₃ | 0x81BBB | | | | | | | | | | | | | | | | | |
| 2222_2222_0222₃ | 0x81BBA | Reserved | | Reserved | 1 | 1 | 1 | 1 | 1 | 1 | 1 | 0 | 1 | 1 | 1 | 0 | 1 | 0 |
| 2222_2222_0221₃ | 0x81BB9 | Reserved | | Reserved | 1 | 1 | 1 | 1 | 1 | 1 | 1 | 0 | 1 | 1 | 1 | 0 | 0 | 1 |
| 2222_2222_0220₃ | 0x81BB8 | Reserved | | Reserved | 1 | 1 | 1 | 1 | 1 | 1 | 1 | 0 | 1 | 1 | 1 | 0 | 0 | 0 |
| 2222_2222_0212₃ | 0x81BB7 | | | | 1 | 1 | 1 | 1 | 1 | 1 | 1 | 0 | 1 | 1 | 0 | x | x | x |
| [3-bits] 0x8 (8) ↕ | | | | | | | | | | | | | | | | | | |
| 2222_2222_0121₃ | 0x81BB0 | Reserved | | Reserved | 1 | 1 | 1 | 1 | 1 | 1 | 1 | 0 | 1 | 0 | x | x | x | x |
| 2222_2222_0120₃ | 0x81BAF | | | | | | | | | | | | | | | | | |
| [4-bits] 0x10 (16) ↕ | | | | | | | | | | | | | | | | | | |
| 2222_2222_0000₃ | 0x81BA0 | Reserved | | Reserved | 1 | 1 | 1 | 1 | 1 | 1 | 1 | 0 | 0 | 1 | 0 | x | x | x |
| 2222_2221_2222₃ | 0x81B9F | | Prohibited | | | | | | | | | | | | | | | |
| 0x10 (16) ↕ | | | | | | | | | | | | | | | | | | |
| 2222_2221_2102₃ | 0x81B90 | | | | 1 | 1 | 1 | 1 | 1 | 1 | 1 | 0 | 0 | 0 | 1 | 0 | 0 | 0 |
| 2222_2221_2101₃ | 0x81B8F | SID scan resp | Prohibited | | | | | | | | | | | | | | | |
| 2222_2221_2100₃ | 0x81B8E | | Prohibited | | | | | | | | | | | | | | | |
| 0xA (10) ↕ | | | | | | | | | | | | | | | | | | |
| 2222_2221_2000₃ | 0x81B85 | Reserved | | Reserved | 1 | 1 | 1 | 1 | 1 | 1 | 1 | 0 | 0 | 0 | 0 | 1 | 0 | 0 |
| 2222_2221_1222₃ | 0x81B84 | | | | 1 | 1 | 1 | 1 | 1 | 1 | 1 | 0 | 0 | 0 | 0 | 0 | 0 | 0 |
| 2222_2221_1221₃ | 0x81B83 | | | | | | | | | | | | | | | | | |
| [2-bits] 0x4 (4) ↕ | | | | | | | | | | | | | | | | | | |
| 2222_2221_1211₃ | 0x81B80 | | | | 1 | 1 | 1 | 1 | 1 | 1 | 1 | 0 | 0 | 0 | 0 | 0 | x | x |

*FIG. 21*

Symbol error study

When single symbol error occurs on
CCIe word = 0000_0000_0000₃ (0x00000)

| Error loc. | S11..S0 (symbols) | T11..T0 (transitions) | Hex | Bits[19:0] | Bits[2:0] |
|---|---|---|---|---|---|
| Good | 0321 0321 0321 | 0000 0000 0000 | 00000 | 0000 0000 0000 0000 0000 | 000 |
| T00^1 | 0321 0321 0320 | 0000 0000 0002 | 00002 | 0000 0000 0000 0000 0010 | 010 |
| T00^2 | 0321 0321 0323 | 0000 0000 0001 | 00001 | 0000 0000 0000 0000 0001 | 001 |
| T01^2 | 0321 0321 0301 | 0000 0000 0011 | 00004 | 0000 0000 0000 0000 0100 | 100 |
| T02^2 | 0321 0321 0121 | 0000 0000 0110 | 0000c | 0000 0000 0000 0000 1100 | 100 |
| T03^2 | 0321 0321 2321 | 0000 0000 1100 | 00024 | 0000 0000 0000 0010 0100 | 100 |
| T04^2 | 0321 0323 0321 | 0000 0001 1000 | 00144 | 0000 0000 0000 0110 0100 | 100 |
| T05^2 | 0321 0301 0321 | 0000 0011 0000 | 003cc | 0000 0000 0000 1100 1100 | 100 |
| T06^2 | 0321 0121 0321 | 0000 0110 0000 | 00b64 | 0000 0000 0000 1011 0100 | 100 |
| T07^2 | 0321 2321 0321 | 0000 1100 0000 | 0222c | 0000 0000 0010 0010 1100 | 100 |
| T08^2 | 0323 0321 0321 | 0001 1000 0000 | 06684 | 0000 0000 0110 0110 0100 | 100 |
| T09^2 | 0301 0321 0321 | 0011 0000 0000 | 1338c | 0000 0001 0011 0011 1100 | 100 |
| T10^2 | 0121 0321 0321 | 0110 0000 0000 | 39aa4 | 0000 0011 1001 1010 0100 | 100 |
| T11^2 | 2321 0321 0321 | 1100 0000 0000 | 39aa4 | 0011 1001 1010 1010 0100 | 100 |

*3 LSBs detect all single symbol errors*

*The higher order symbol error, the more burst error*

*Single wire error that do not cause clock miss*

FIG. 23

EXEMPLARY SYMBOL ERROR WITH NO CLOCK MISS (NO SYMBOL SLIP)

When single symbol error occurs on
CCIe word = 1111_1111_1111₃ (0x40DF8)

| Error loc. | S11..S0 (symbols) | T11..T0 (transitions) | Hex | Bits[19:0] | Bits[2:0] |
|---|---|---|---|---|---|
| Good | 2301 2301 2301 | 1111 1111 1111 | 40df8 | 0100 0000 1101 1111 1000 | 000 |
| T00^2 | 2301 2301 2301 | 1111 1111 1110 | 40df7 | 0100 0000 1101 1111 0111 | 111 |
| T00^3 | 2301 2301 2301 | 1111 1111 1112 | 40df9 | 0100 0000 1101 1111 1001 | 001 |
| T01^2 | 2301 2301 2321 | 1111 1111 1100 | 40df4 | 0100 0000 1101 1111 0100 | 100 |
| T02^2 | 2301 2301 2201 | 1111 1111 1001 | 40dec | 0100 0000 1101 1110 1100 | 100 |
| T03^2 | 2301 2301 0301 | 1111 1111 0011 | 40dd4 | 0100 0000 1101 1101 0100 | 100 |
| T04^2 | 2301 2301 2301 | 1111 1110 0111 | 40d8c | 0100 0000 1101 1000 1100 | 100 |
| T05^2 | 2301 2321 2301 | 1111 1100 1111 | 40cb4 | 0100 0000 1100 1011 0100 | 100 |
| T06^2 | 2301 2201 2301 | 1111 1001 1111 | 40a2c | 0100 0000 1010 0010 1100 | 100 |
| T07^2 | 2301 0301 2301 | 1111 0011 1111 | 40294 | 0100 0000 0010 1001 0100 | 100 |
| T08^2 | 2303 2301 2301 | 1110 0111 1111 | 3ebcc | 0011 1010 1011 1100 1100 | 100 |
| T09^2 | 2321 2301 2301 | 1100 1111 1111 | 3a774 | 0011 1010 0111 0111 0100 | 100 |
| T10^2 | 2101 2301 2301 | 1001 1111 1111 | 2da6c | 0010 1101 1010 0110 1100 | 100 |
| T11^2 | 0301 2301 2301 | 0011 1111 1111 | 07354 | 0000 0111 0011 0101 0100 | 100 |

*FIG. 24*

EXEMPLARY SYMBOL ERROR WITH NO CLOCK MISS (NO SYMBOL SLIP)

When single symbol error occurs on
CCIe word = 0120_1201_2012₃ (0x18F38)

| Error loc. | S11..S0 (symbols) | T11..T0 (transitions) | Hex | Bits[19:0] | Bits[2:0] |
|---|---|---|---|---|---|
| Good | 0132 3101 3231 | 0120 1201 2012 | 18f38 | 0001 1000 1111 0011 1000 | 000 |
| T00^1 | 0132 3101 3230 | 0120 1201 2011 | 18f37 | 0001 1000 1111 0011 0111 | 111 |
| T00^3 | 0132 3101 323? | 0120 1201 2010 | 18f36 | 0001 1000 1111 0011 0110 | 110 |
| T01^3 | 0132 3101 3201 | 0120 1201 2021 | 18f3a | 0001 1000 1111 0011 1010 | 010 |
| T02^2 | 0132 3101 3031 | 0120 1201 2102 | 18f3e | 0001 1000 1111 0011 1110 | 110 |
| T02^3 | 0132 3101 3?31 | 0120 1201 2222 | 18f4d | 0001 1000 1111 0100 1101 | 101 |
| T03^3 | 0132 3101 0231 | 0120 1201 0212 | 18f14 | 0001 1000 1111 0001 0100 | 100 |
| T04^3 | 0132 310? 3231 | 0120 1202 1012 | 18f6e | 0001 1000 1111 0110 1110 | 110 |
| T05^2 | 0132 3121 3231 | 0120 1222 2012 | 18fda | 0001 1000 1111 1101 1010 | 010 |
| T05^3 | 0132 3131 3231 | 0120 1210 2012 | 18f6c | 0001 1000 1111 0110 1100 | 100 |
| T06^3 | 0132 3?01 3231 | 0120 1021 2012 | 1916f | 0001 1001 0001 0110 1111 | 111 |
| T07^3 | 0132 3?01 3231 | 0120 1222 2012 | 18b6c | 0001 1000 1011 0110 1100 | 100 |
| T08^2 | 0132 0101 3231 | 0120 2101 2012 | 194ea | 0001 1001 0100 1110 1010 | 010 |
| T08^3 | 0130 3101 3231 | 0121 0201 2012 | 1a04e | 0001 1010 0000 0100 1110 | 110 |
| T09^2 | 0131 3101 3231 | 0122 2201 2012 | 1cb05 | 0001 1100 1011 0000 0101 | 101 |
| T09^3 | 0102 3101 3231 | 0102 1201 2012 | 128b4 | 0001 0010 1000 1011 0100 | 100 |
| T10^2 | 0?32 3101 3231 | 0210 1201 2012 | 228fe | 0010 0010 1000 1111 1110 | 110 |
| T10^3 | 2132 3101 3231 | 1020 1201 2012 | 35c8a | 0011 0101 1100 1000 1010 | 010 |
| T11^2 | 2132 3101 3231 | 2220 1201 2012 | 7ddd7 | 0111 1101 1101 1101 0111 | 111 |
| T11^3 | 3132 3101 3231 | 2220 1201 2012 | 7ddd7 | 0111 1101 1101 1101 0111 | 111 |

FIG. 26

FIG. 27 — EXEMPLARY SYMBOL ERROR WITH NO CLOCK MISS (NO SYMBOL SLIP)

When single symbol error occurs on CCIe word = 1201_2012_0120₃ (0x4ADA8)

| Error loc. | S11..S0 (symbols) | T11..T0 (transitions) | Hex | Bits[19:0] | Bits[2:0] |
|---|---|---|---|---|---|
| Good | 2030 2120 3021 | 1201 2012 0120 | 4ada8 | 0100 1010 1101 1010 1000 | 000 |
| T00^1 | 2030 2120 3020 | 1201 2012 0122 | 4adaa | 0100 1010 1101 1010 1010 | 010 |
| T00^2 | 2030 2120 3023 | 1201 2012 0121 | 4ada9 | 0100 1010 1101 1010 1001 | 001 |
| T01^1 | 2030 2120 3031 | 1201 2012 0102 | 4ada4 | 0100 1010 1101 1010 0100 | 100 |
| T02^1 | 2030 2120 3121 | 1201 2012 0210 | 4adae | 0100 1010 1101 1010 1110 | 110 |
| T03^1 | 2030 2120 2021 | 1201 2012 2220 | 4ade7 | 0100 1010 1101 1110 0111 | 111 |
| T03^2 | 2030 2120 1021 | 1201 2012 1020 | 4adba | 0100 1010 1101 1011 1010 | 010 |
| T04^1 | 2030 2121 3021 | 1201 2010 0120 | 4ad3c | 0100 1010 1101 0011 1100 | 100 |
| T05^1 | 2030 2130 3021 | 1201 2021 0120 | 4ae4a | 0100 1010 1110 0100 1010 | 010 |
| T06^1 | 2030 2220 3021 | 1201 2222 0120 | 4b44d | 0100 1011 0100 0100 1101 | 101 |
| T06^2 | 2030 2020 3021 | 1201 2102 0120 | 4af8e | 0100 1010 1111 1000 1110 | 110 |
| T07^1 | 2030 3120 3021 | 1201 0212 0120 | 4a244 | 0100 1010 0010 0100 0100 | 100 |
| T08^1 | 2031 2120 3021 | 1202 1012 0120 | 4bebe | 0100 1011 1110 1011 1110 | 110 |
| T09^1 | 2020 2120 3021 | 1222 2012 0120 | 5610f | 0101 0110 0001 0000 1111 | 111 |
| T09^2 | 2010 2120 3021 | 1210 2012 0120 | 4e0ea | 0100 1110 0000 1110 1010 | 010 |
| T10^1 | 2130 2120 3021 | 1021 2012 0120 | 37a1c | 0011 0111 1010 0001 1100 | 100 |
| T11^1 | 3030 2120 3021 | 2101 2012 0120 | 67afa | 0110 0111 1010 1111 1010 | 010 |
| T11^2 | 0030 2120 3021 | 0001 2012 0120 | 02c5b | 0000 0010 1100 0101 1011 | 011 |

EXEMPLARY SYMBOL ERROR WITH NO CLOCK MISS (NO SYMBOL SLIP)

When wire single symbol error occurs on CCIe word = $2012\_0120\_1201_3$ (0x5ED08)

| Error loc. | S11..S0 (symbols) | T11..T0 (transitions) | Hex | Bits[19:0] | Bits[2:0] |
|---|---|---|---|---|---|
| Good | 3231 0132 3101 | 2012 0120 1201 | 5ed08 | 0101 1110 1101 0000 1000 | 000 |
| T00^2 | 3231 0132 3103 | 2012 0120 1200 | 5ed07 | 0101 1110 1101 0000 0111 | 111 |
| T00^3 | 3231 0132 3102 | 2012 0120 1202 | 5ed09 | 0101 1110 1101 0000 1001 | 001 |
| T01^2 | 3231 0132 3121 | 2012 0120 1210 | 5ed0a | 0101 1110 1101 0000 1010 | 010 |
| T01^3 | 3231 0132 3131 | 2012 0120 1222 | 5ed0f | 0101 1110 1101 0000 1111 | 111 |
| T02^2 | 3231 0132 3101 | 2012 0120 1021 | 5ecfc | 0101 1110 1100 1111 1100 | 100 |
| T02^3 | 3231 0132 3101 | 2012 0120 2101 | 5ed1a | 0101 1110 1101 0001 1010 | 010 |
| T03^2 | 3231 0130 3101 | 2012 0121 0201 | 5ed3e | 0101 1110 1101 0011 1110 | 110 |
| T03^3 | 3231 0131 3101 | 2012 0122 2201 | 5edc5 | 0101 1110 1101 1100 0101 | 101 |
| T04^2 | 3231 0102 3101 | 2012 0102 1201 | 5ebc4 | 0101 1110 1011 1100 0100 | 100 |
| T04^3 | 3231 0132 3101 | 2012 0210 1201 | 5eeee | 0101 1110 1110 1110 1110 | 110 |
| T05^3 | 3231 0232 3101 | 2012 1020 1201 | 5f2ba | 0101 1111 0010 1011 1010 | 010 |
| T06^3 | 3231 2132 3101 | 2012 2220 1201 | 600f7 | 0110 0000 0000 1111 0111 | 111 |
| T07^2 | 3132 0132 3101 | 2010 0120 1201 | 5cadc | 0101 1100 1010 1101 1100 | 100 |
| T07^3 | 3232 0132 3101 | 2021 0120 1201 | 6204a | 0110 0010 0000 0100 1010 | 010 |
| T08^3 | 3201 0132 3101 | 2102 0120 1201 | 686ce | 0110 1000 0110 1100 1110 | 110 |
| T09^3 | 3131 0132 3101 | 2202 0120 1201 | 8073d | 1000 0000 0111 0011 1101 | 101 |
| T10^2 | 0231 0132 3101 | 0212 0120 1201 | 25264 | 0010 0101 0010 0110 0100 | 100 |

FIG. 28

ERROR DETECTION — USING FIXED CONSTANT BIT
- Checking 3-LSB of Bits[19:0] detects any single symbol error; No error in any Bits[19:0] from 0x00000 to 0x81BF0 is missed.
  → Sending any known value, such as '000' for Bits[2:0] would provide 100% detection for such error.
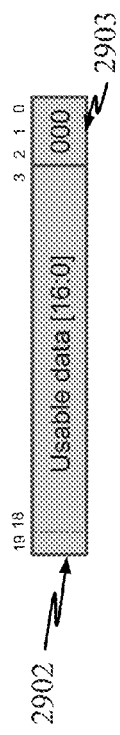
- However that would cost 3 out of 19 (~19.02) bits information.
- Compromise: Fix Bits[0] to 0, take checksum for Bits[2:1]
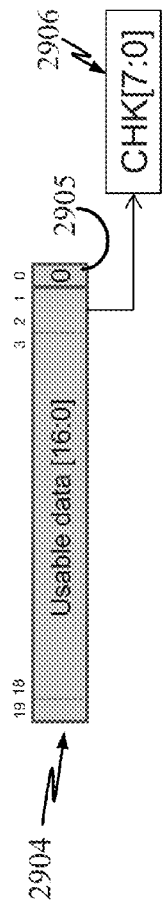
*FIG. 29*

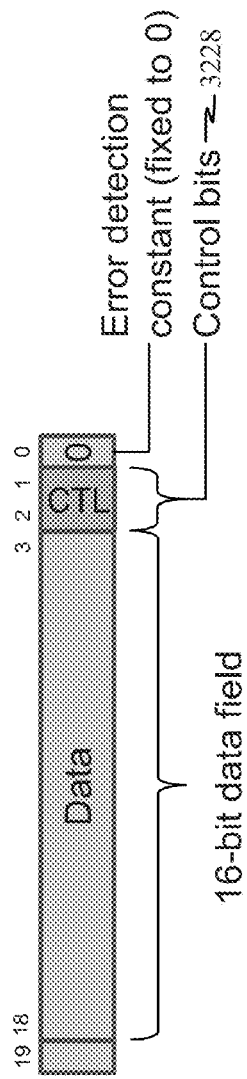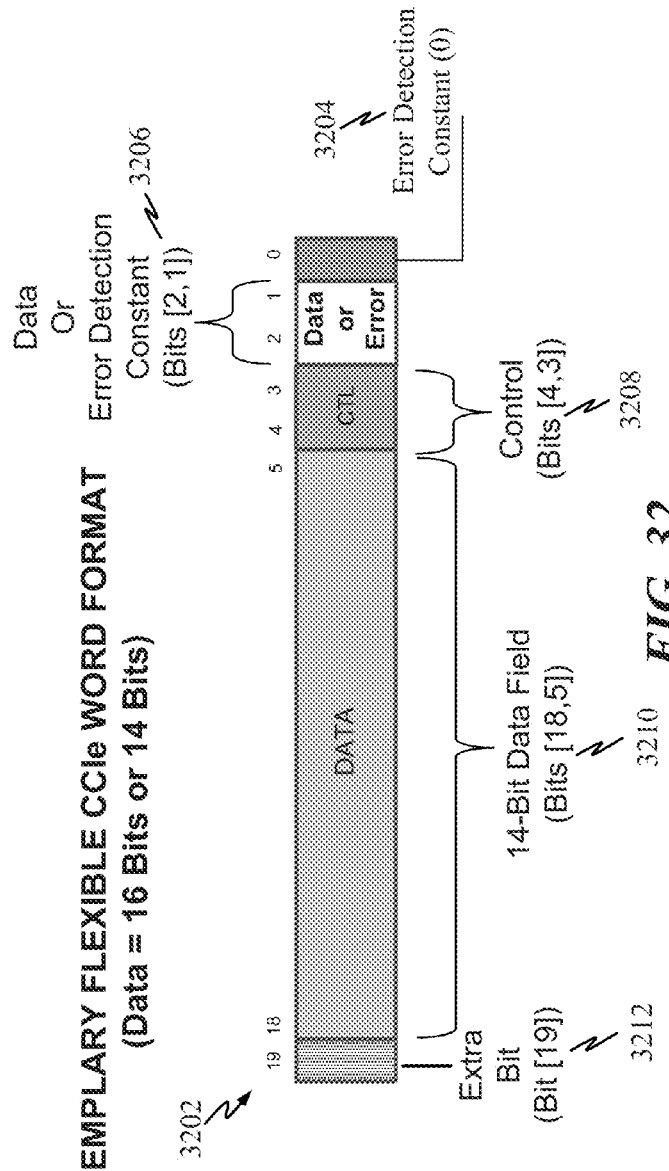
FIG. 32

*Method for Error Detection*

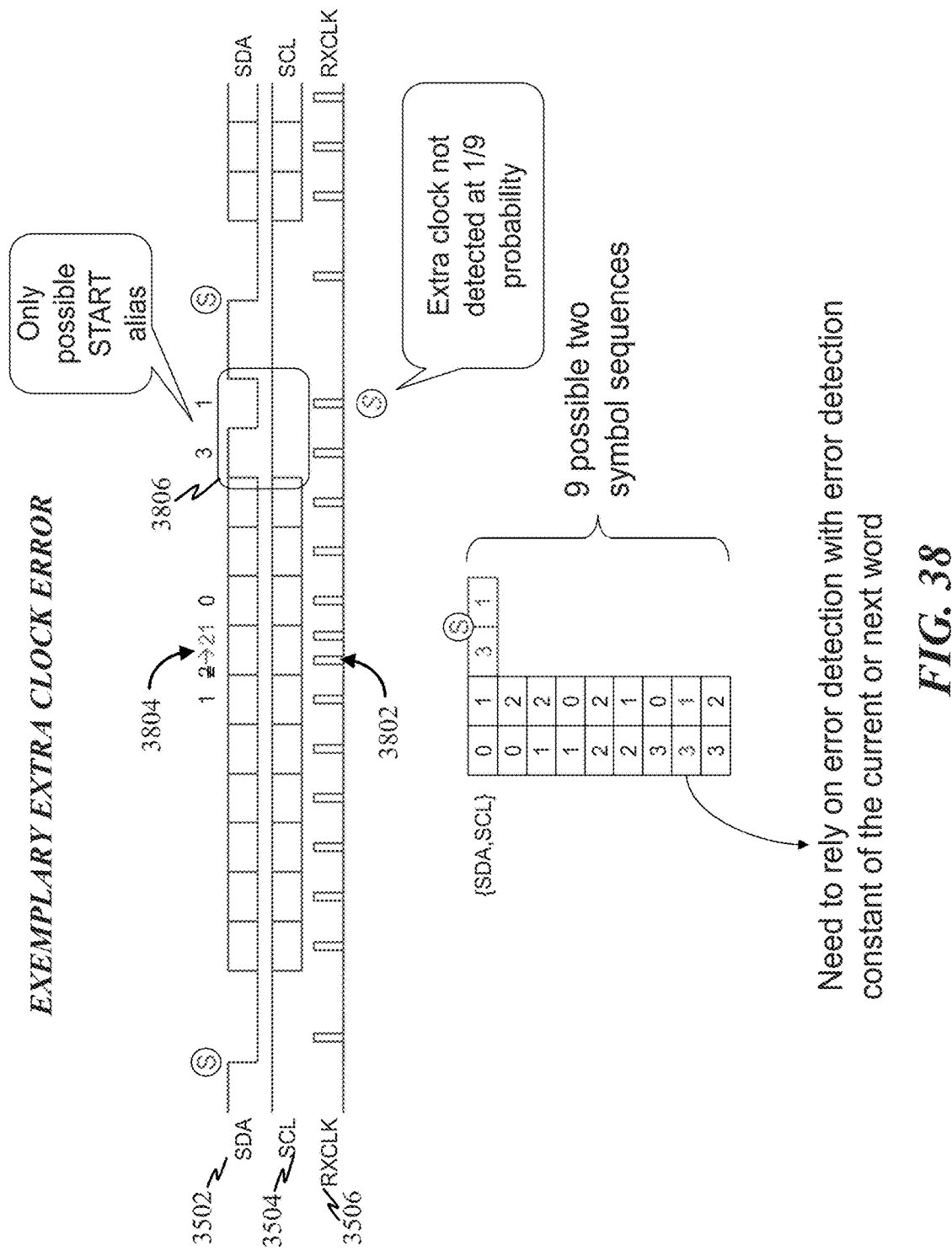

ERROR DETECTION CAPABILITY OVER CCIE PROTOCOL

CROSS-REFERENCE TO RELATED APPLICATIONS

The present application for patent claims priority to U.S. Provisional Application No. App. No. 61/889,030, entitled "Error Correction Capability Over CCIe Bus", filed Oct. 9, 2013, and U.S. Provisional Application No. App. No. 61/946,647, entitled "Bit Allocation Over A Camera Control Interface Extended Bus", filed Feb. 28, 2014, both assigned to the assignee hereof and hereby expressly incorporated by reference herein.

FIELD

The present disclosure pertains to enabling efficient operations over a shared bus and, more particularly, facilitating error detection over a shared Camera Control Interface extended (CCIe) bus.

BACKGROUND

I2C (also referred to as $I^2C$) is a multi-master serial single-ended bus used for attaching low-speed peripherals to a motherboard, embedded system, cellphone, or other electronic devices. The I2C bus includes a clock (SCL) and data (SDA) lines with 7-bit addressing. The bus has two roles for devices: master and slave. A master device is a device that generates the clock and initiates communication with slave devices. A slave device is a device that receives the clock and responds when addressed by the master. The I2C bus is a multi-master bus which means any number of master devices can be present. Additionally, master and slave roles may be changed between messages (after a STOP is sent). I2C defines basic types of messages, each of which begins with a START and ends with a STOP.

In this context of a camera implementation, unidirectional transmissions may be used to capture an image from a sensor and transmit such image data to memory in a baseband processor, while control data may be exchanged between the baseband processor and the sensor as well as other peripheral devices. In one example, a Camera Control Interface (CCI) protocol may be used for such control data between the baseband processor and the image sensor (and/or one or more slave devices). In one example, the CCI protocol may be implemented over an I2C serial bus between the image sensor and the baseband processor.

It would be desirable to provide error detection in transmissions between devices sharing a bus.

SUMMARY

A device is provided comprising a shared bus, a slave device, and a master device. The slave device may be coupled to the shared bus. The master device may be coupled to the control data bus and adapted to manage communications on the shared bus. Transmissions over the shared bus are a plurality of bits that are encoded into ternary numbers which are then transcoded into symbols for transmission, and either the 3 least significant bits or the least significant in the plurality of bits are used for error detection of the transmission.

The shared bus may be a two-line bus and both lines of the two-line bus are used to transfer the symbols. A clock signal may be embedded within symbol-to-symbol transitions. The slave device may implements a state machine logic circuit that detects erroneous clock pulse misses and an erroneous extra clock pulses in the clock signal.

In one example, the plurality of bits may be a twenty-bit sequence. Use of the 3 least significant bits for error detection guarantees detection of an error in the whole twenty-bit sequence. Additionally, use of the second and third least significant bits may be flexibly allocated to either data transmissions or error detection. When the 3 least significant bits are used for error detection, the value of the 3 least significant bits may be set to a constant binary value of either "000" or "111".

Use of the least significant bit for error detection guarantees detection of a single-symbol error in the whole twenty-bit sequence only approximately fifty percent of the time. In one example, when only the least significant bit is used for error detection, the value of the least significant bit is set to a constant binary value of either "1" or "0".

According to one aspect, a transmitter device is provided comprising a bus interface and a processing circuit. The bus interface may serve to couple the transmitter device to a shared bus (to which receiving or slave devices are coupled). The transmitter device may manage or control communications over the shared bus. The processing circuit may be configured to: (a) obtain plurality of bits to be transmitted over a shared bus, where either the 3 least significant bits or the least significant in the plurality of bits are used for error detection; (b) convert the plurality of bits are into a ternary number; (c) convert digits of the ternary number into sequential symbols; (d) combine a plurality of symbols are into a word for transmission; and/or (e) transmit the word over the shared bus to a receiving device. A clock may be embedded within symbol-to-symbol transitions. The shared bus may be a two-line bus and both lines of the two-line bus are used to transfer the symbols. The processing circuit may be further configured to: (a) compute a checksum for the transmitted bits; and/or (b) transmit the checksum for the transmitted bits to the receiving device. The checksum may be inserted within any arbitrary word for transmission to the receiving device.

According to another aspect, a receiver device is provided comprising: a bus interface and a processing circuit. The bus interface may serve to couple to a shared bus on which communications are managed by a master device. The processing circuit may be configured to: (a) receive a plurality of symbols over the shared bus; (b) convert the plurality of symbols into digits; (c) combine the digits into a ternary number; (d) convert the ternary number into bits, where either the 3 least significant bits or the least significant in the plurality of bits are used for error detection; and/or (e) ascertain an error within the received plurality of bits based on either the 3 least significant bits or the least significant in the plurality of bits. A clock may be embedded within symbol-to-symbol transitions of the plurality of received symbols. The shared bus may be a two-line bus and both lines of the two-line bus are used to transfer the symbols. The receiver device may implement a state machine logic circuit that detects erroneous clock pulse misses and an erroneous extra clock pulses in the clock signal.

DRAWINGS

Various features, nature, and advantages may become apparent from the detailed description set forth below when taken in conjunction with the drawings in which like reference characters identify correspondingly throughout.

FIG. 5 illustrates the conversion between transition numbers and sequential symbols.

Figure 10:
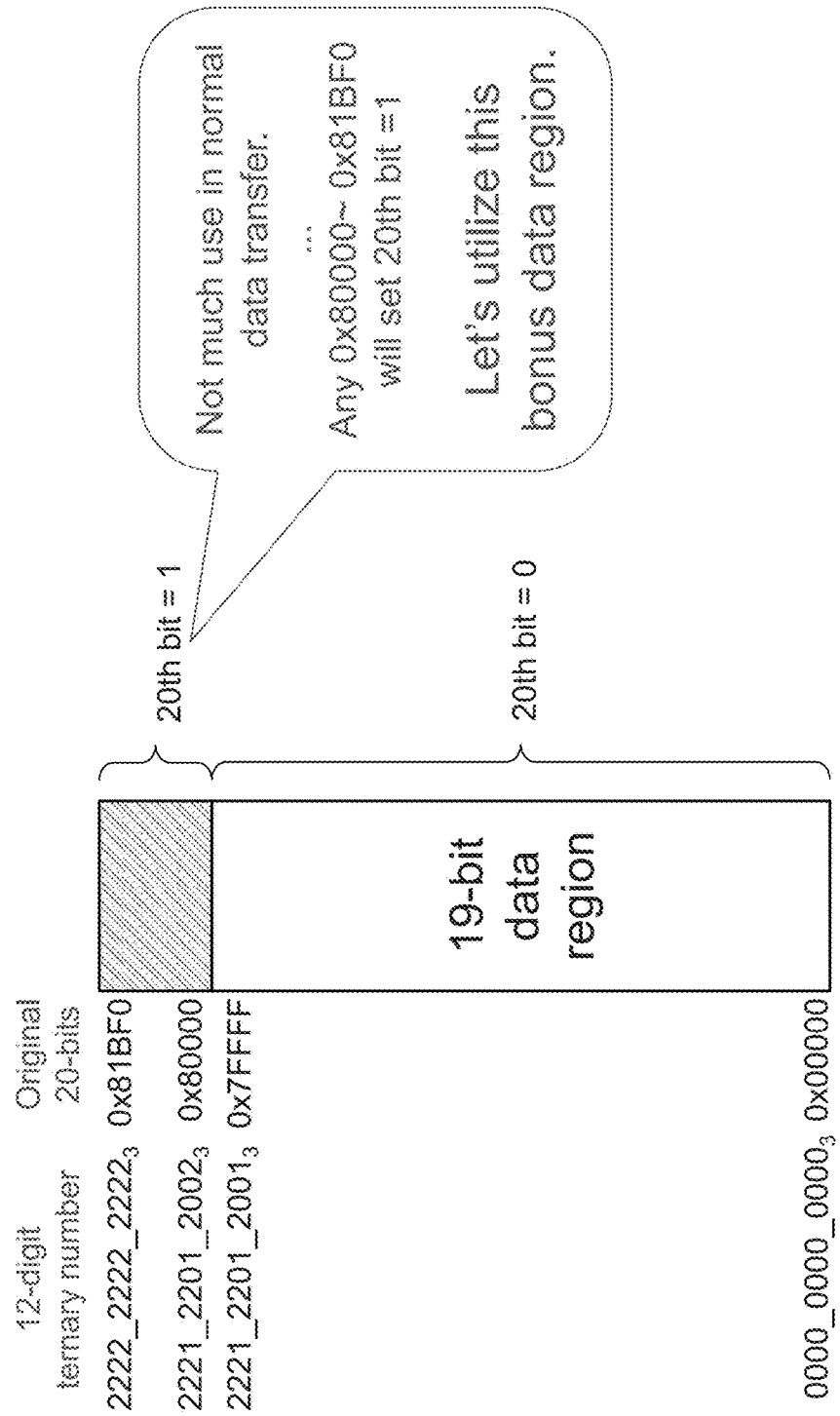

FIG. 10 conceptually illustrates a bit 19 (i.e., the $20^{th}$ bit when the bit count starts at the first bit being bit 0) is mostly unused in the CCIe protocol and may be used for commands between devices on the shared bus.

Figure 11:
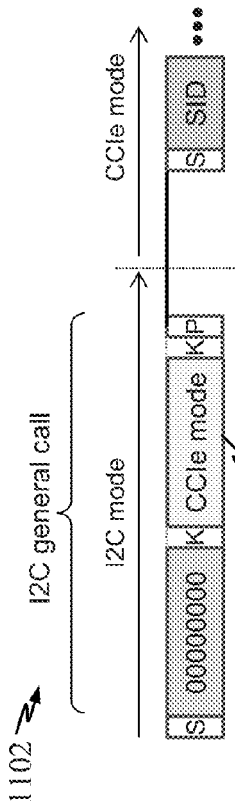

FIG. 11 illustrates an exemplary general call for CCIe mode entry indicator that may be sent by a master device over a shared bus to indicate to slave devices that the shared bus is switching to operate from I2C mode to CCIe mode.

Figure 12:
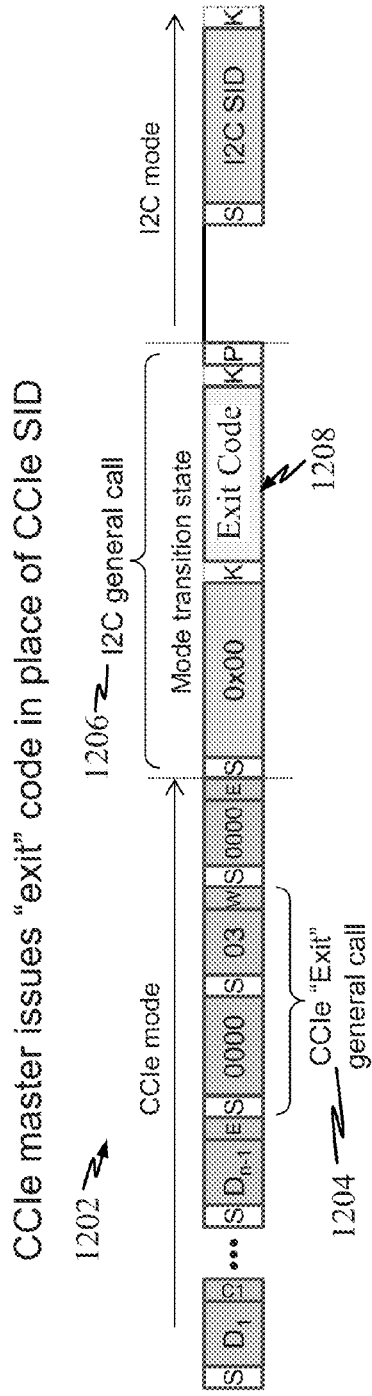

FIG. 12 illustrates an exemplary CCIe call that may be issued by a CCIe master device (e.g., master device in FIG. 1 while in I2C mode) to indicate a transition from CCIe mode to I2C mode to all CCIe able devices.

Figure 13:
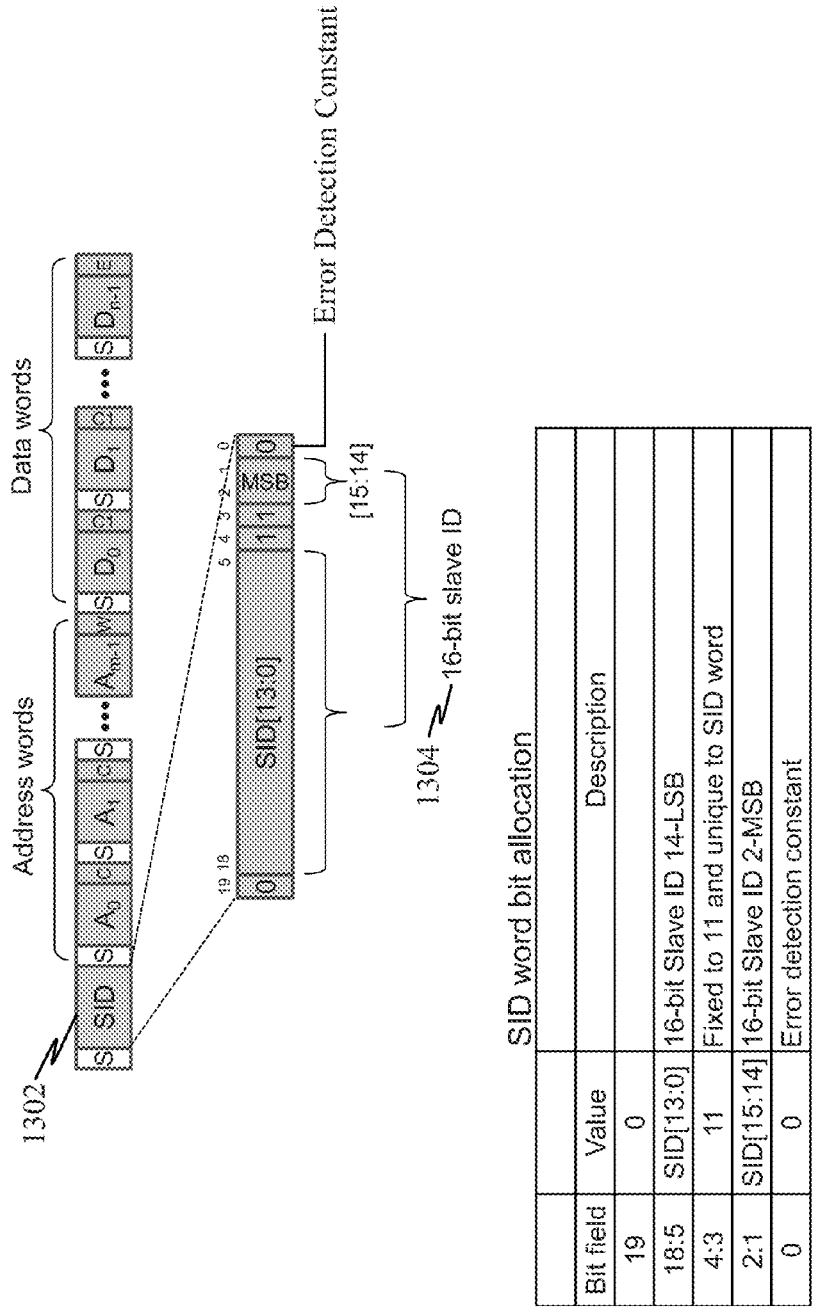

FIG. 13 illustrates an exemplary CCIe slave identifier (SID) word format.

Figure 14:
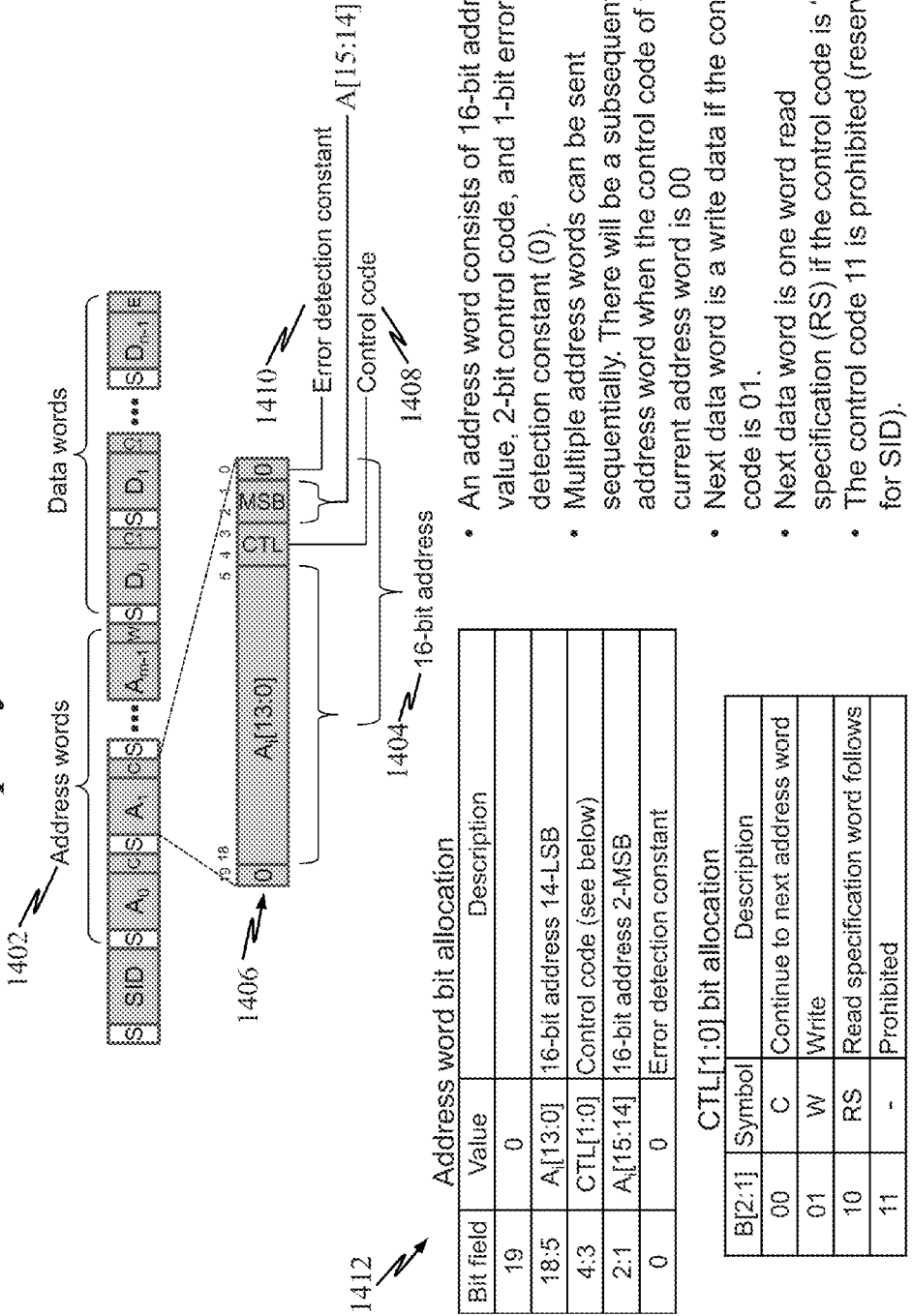

FIG. 14 illustrates an exemplary CCIe address word format.

Figure 15:
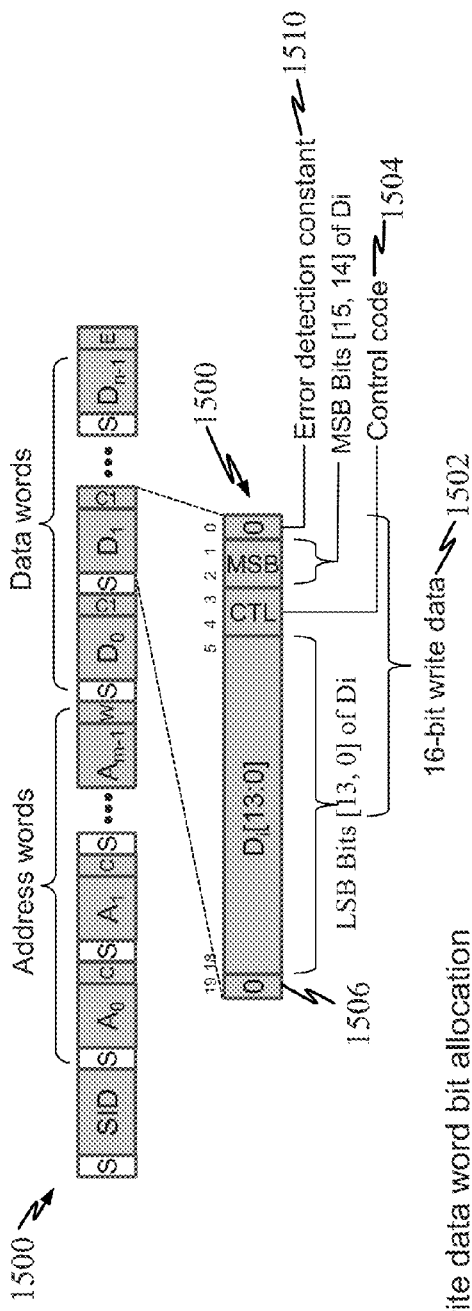

FIG. 15 illustrates an exemplary write data word format.

Figure 16:
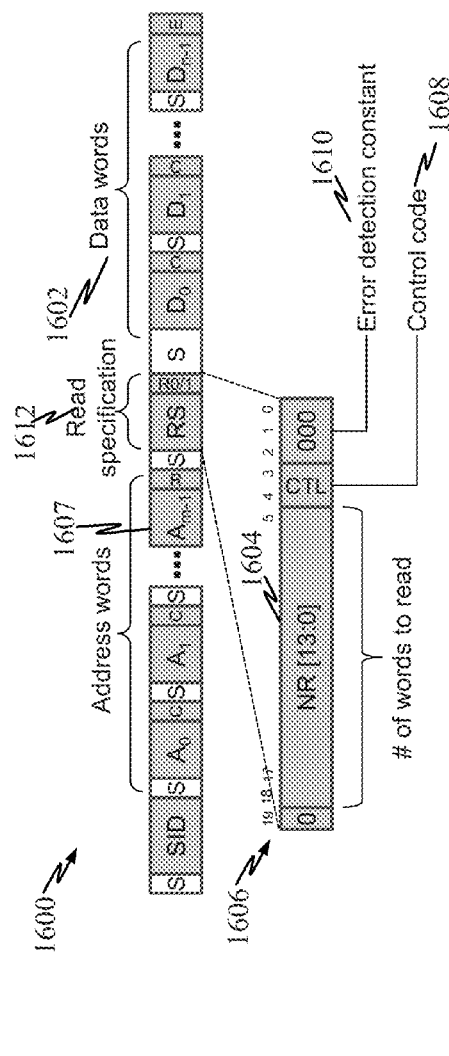

FIG. 16 illustrates an exemplary read specification word format.

Figure 17:
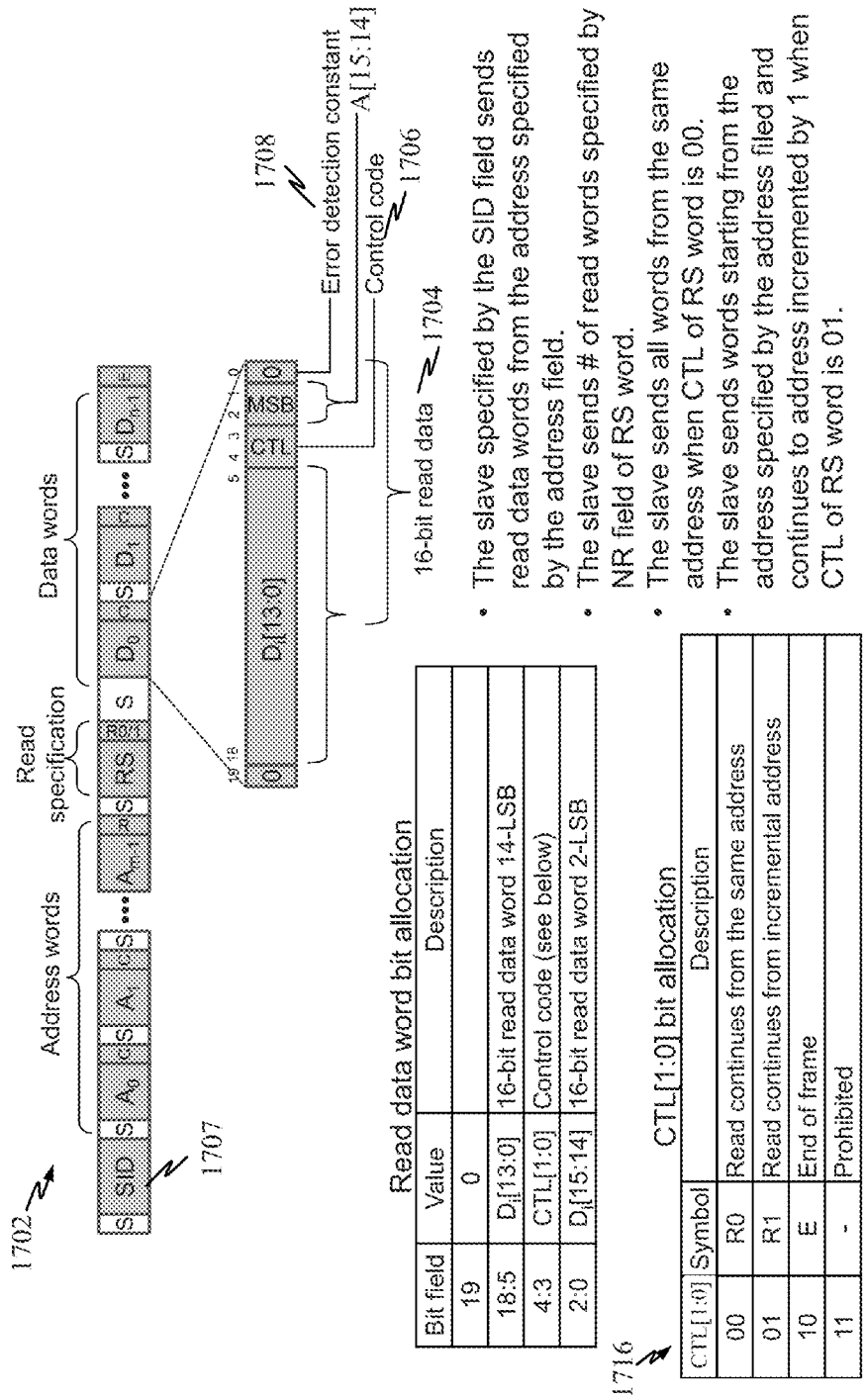

FIG. 17 illustrates an exemplary read data word format.

Figure 18:
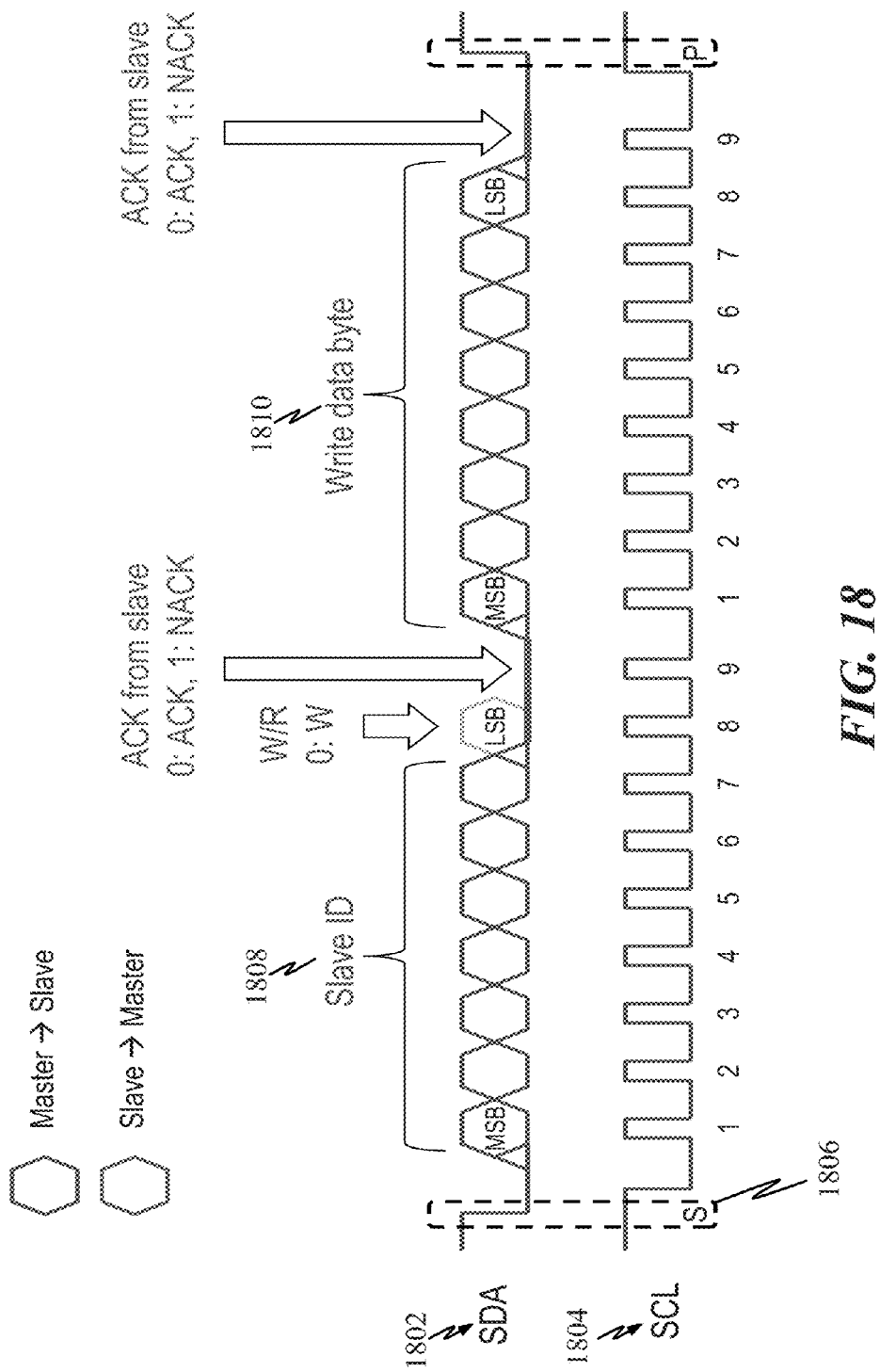

FIG. 18 illustrates an exemplary timing diagram of an I2C one byte write data operation.

Figure 19:
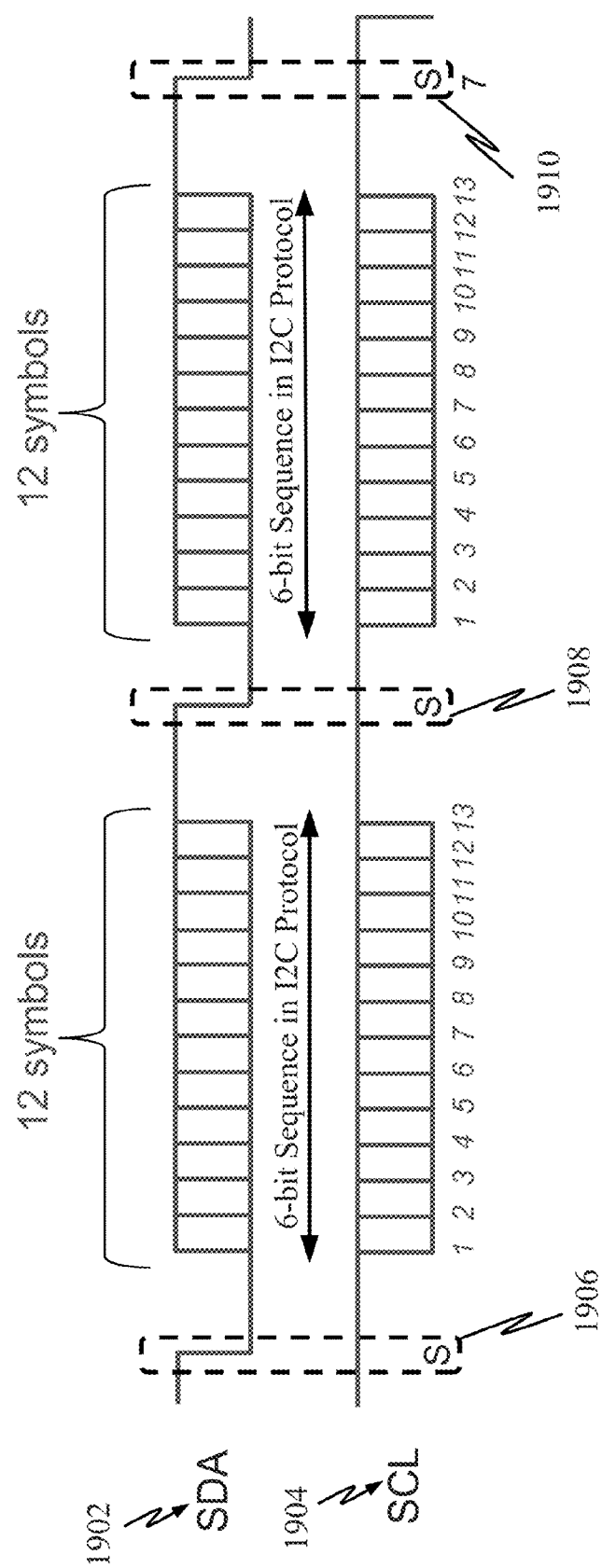

FIG. 19 illustrates an exemplary CCIe transmission in which data bits have be transcoded into twelve symbols for transmission over the SDA line and the SCL line.

FIG. 20 illustrates an exemplary mapping of the $20^{th}$ bit (bit 19) resulting from the encoding scheme illustrated in FIGS. 2-10.

FIG. 21 illustrates details of a sub-region within the exemplary mapping of the $20^{th}$ bit (bit 19) region of FIG. 20.

Figure 22:
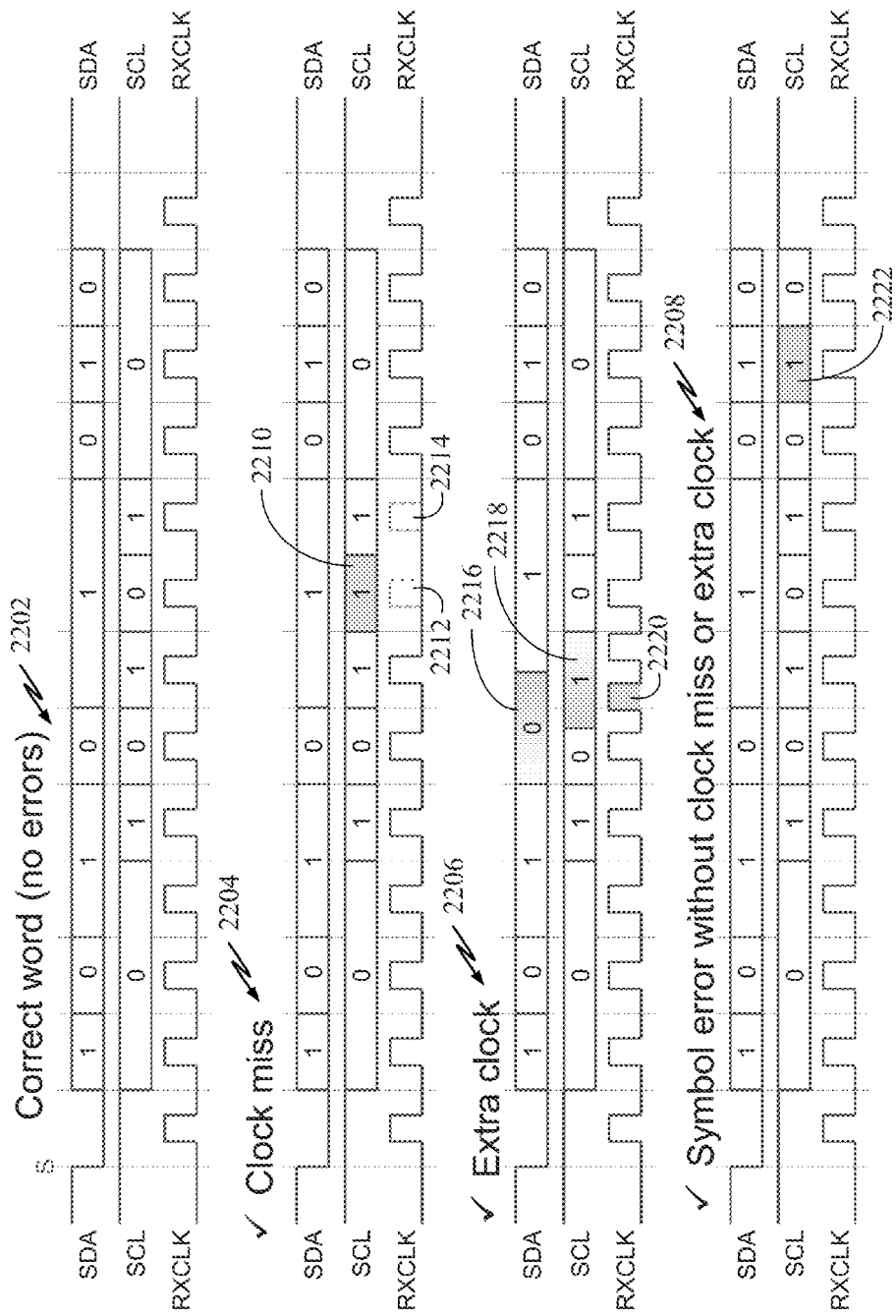

FIG. 22 illustrates various symbol error conditions that may occur.

FIG. 23 illustrates a table showing the possible errors in the transmitted symbol sequence 0321_0321_0321 (which translates to binary sequence 0000_0000_0000_0000_0000 and ternary number 0000_0000_0000$_3$) and how such errors are detectable within the three least significant bits.

FIG. 24 illustrates a table showing the possible errors in the transmitted symbol sequence 2301_2301_2301 (which translates to binary sequence 0100_0000_1101_1111_1000 and ternary number 1111_1111_1111$_3$) and how such errors are detectable within the three least significant bits.

Figure 25:

FIG. 25 illustrates a table showing the possible errors in the transmitted symbol sequence 3131_3131_3131 (which translates to binary sequence 1000_0001_1011_1111_0000 and ternary number 2222_2222_2222$_3$) and how such errors are detectable within the three least significant bits.

FIG. 26 illustrates a table showing the possible errors in the transmitted symbol sequence 0132_3101_3231 and how such errors are detectable within the three least significant bits.

FIG. 27 illustrates a table showing the possible errors in the transmitted symbol sequence 2030_2120_3021 and how such errors are detectable within the three least significant bits.

FIG. 28 illustrates a table showing the possible errors in the transmitted symbol sequence 3231_0132_3101 and how such errors are detectable within the three least significant bits.

FIG. 29 illustrates how a CCIe word may use the three least significant bits or the least significant bit for error detection.

Figure 30:
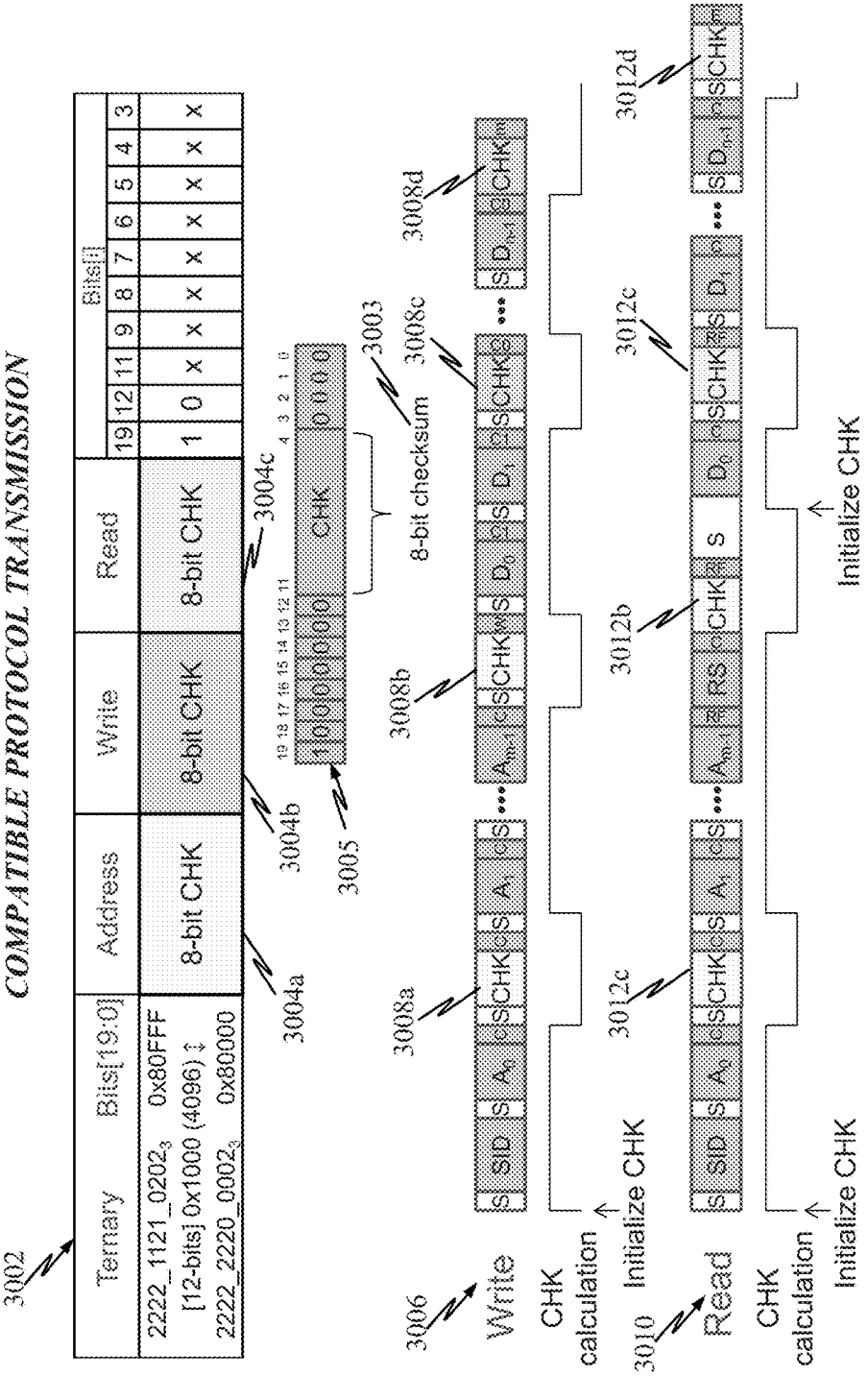

FIG. 30 illustrates how an 8-bit checksum may be implemented within a CCIe word.

Figure 31:
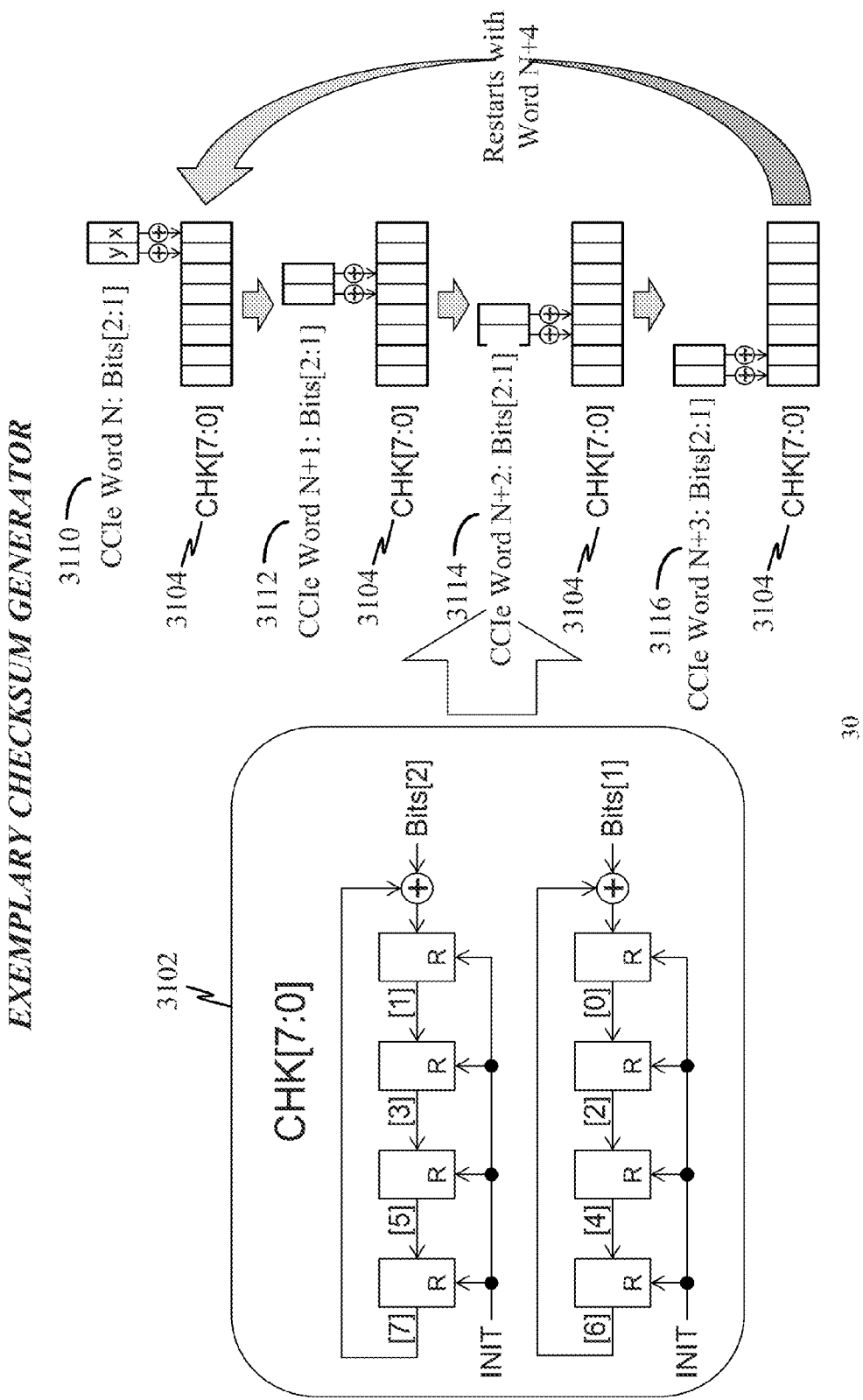

FIG. 31 illustrates an exemplary implementation of an 8-bit checksum generator.

FIG. 32 illustrates an exemplary CCIe word format which facilitates error detection.

Figure 33:
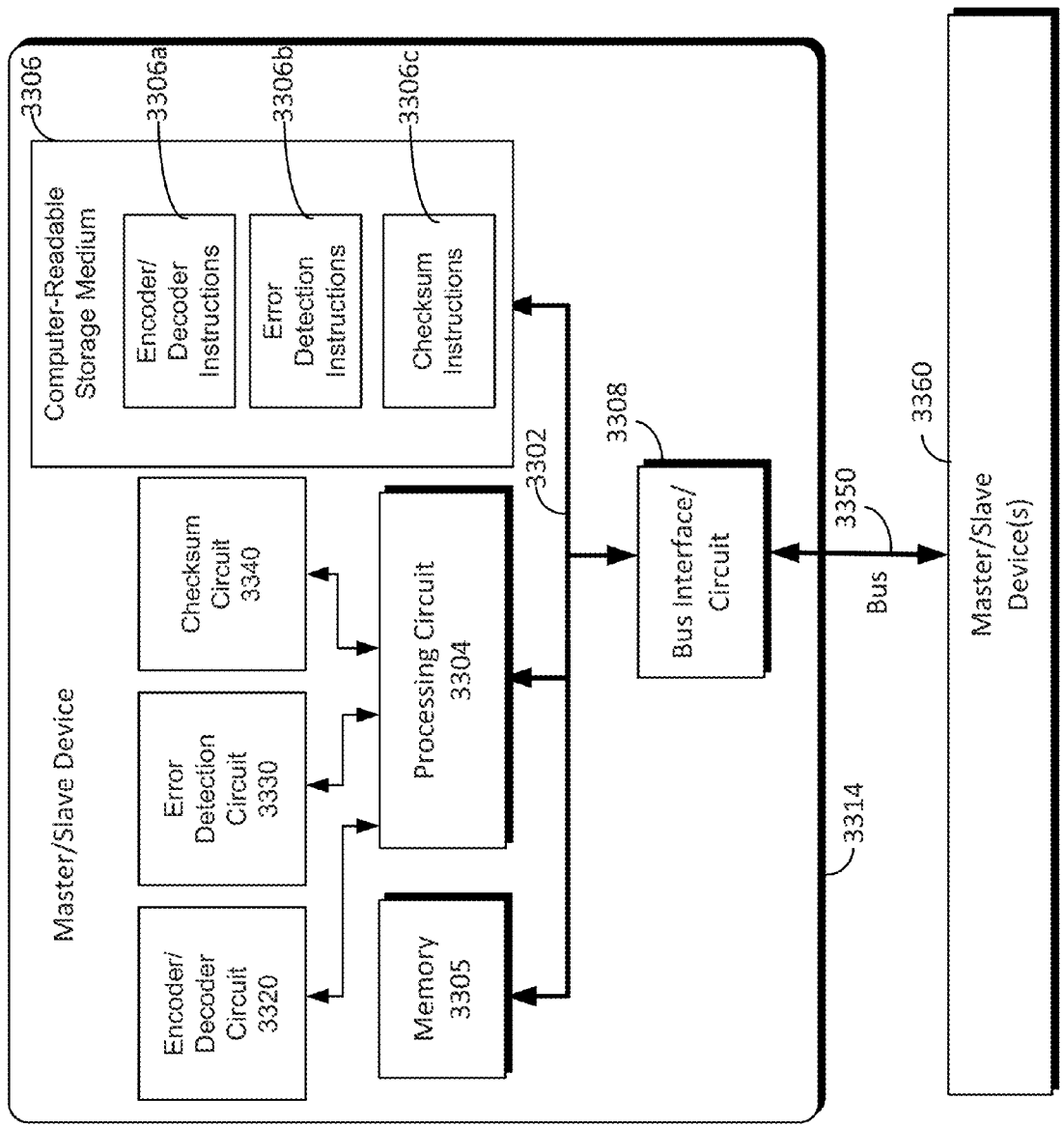

FIG. 33, a block diagram illustrating exemplary components of a master/slave device is provided in accordance with the disclosure.

Figure 34:
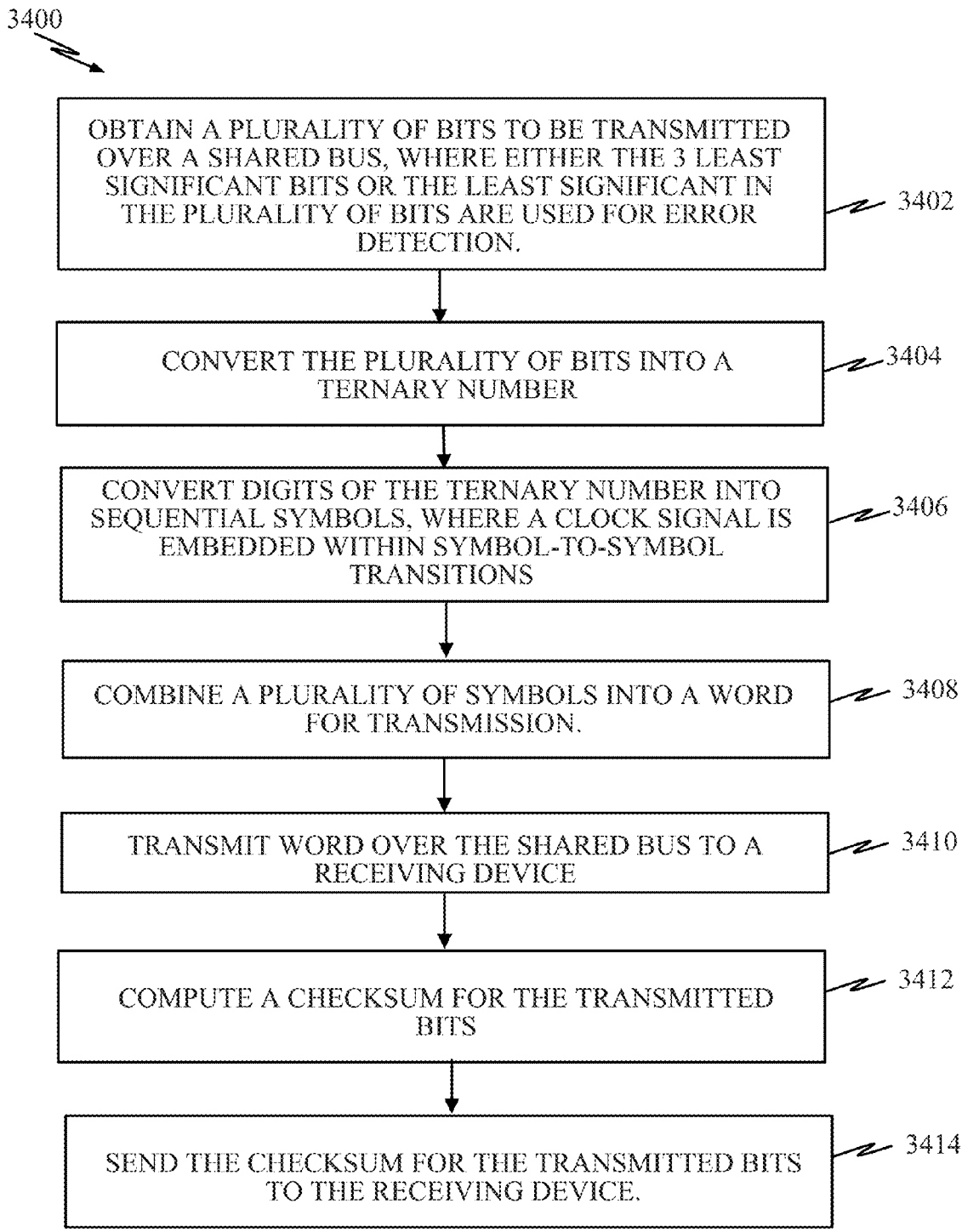

FIG. 34 illustrates an exemplary method that facilitates communication in accordance with one or more error detection features of a protocol (e.g., CCIe protocol).

Figure 35:
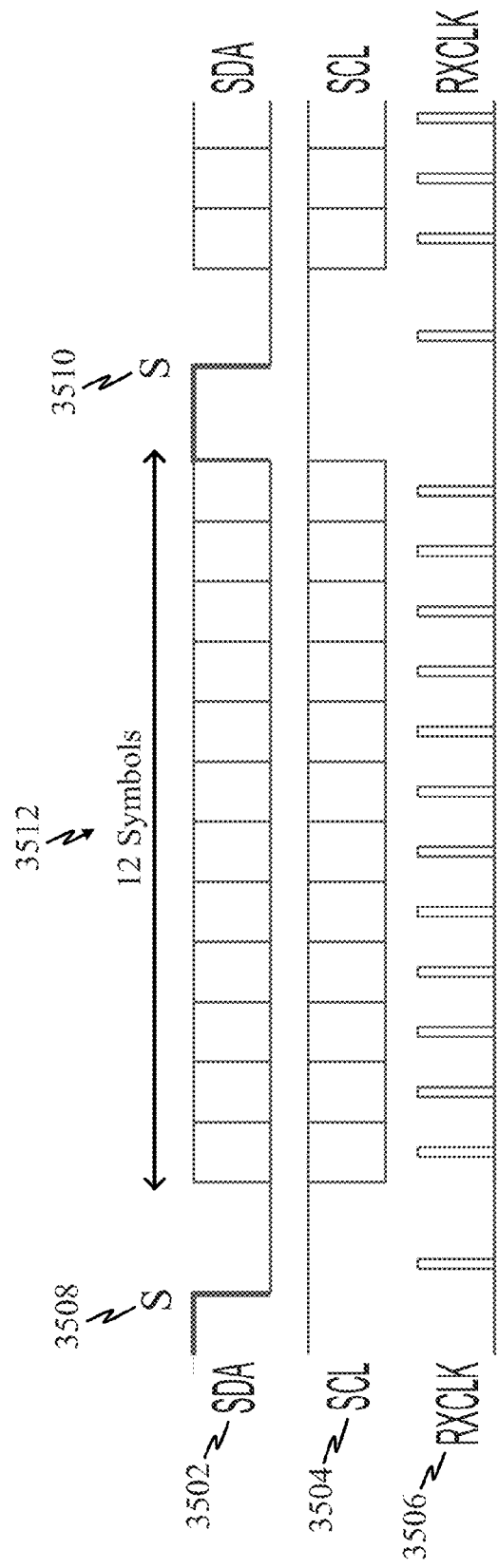

FIG. 35 illustrates an exemplary CCIe word transmission with no clock errors.

Figure 36:
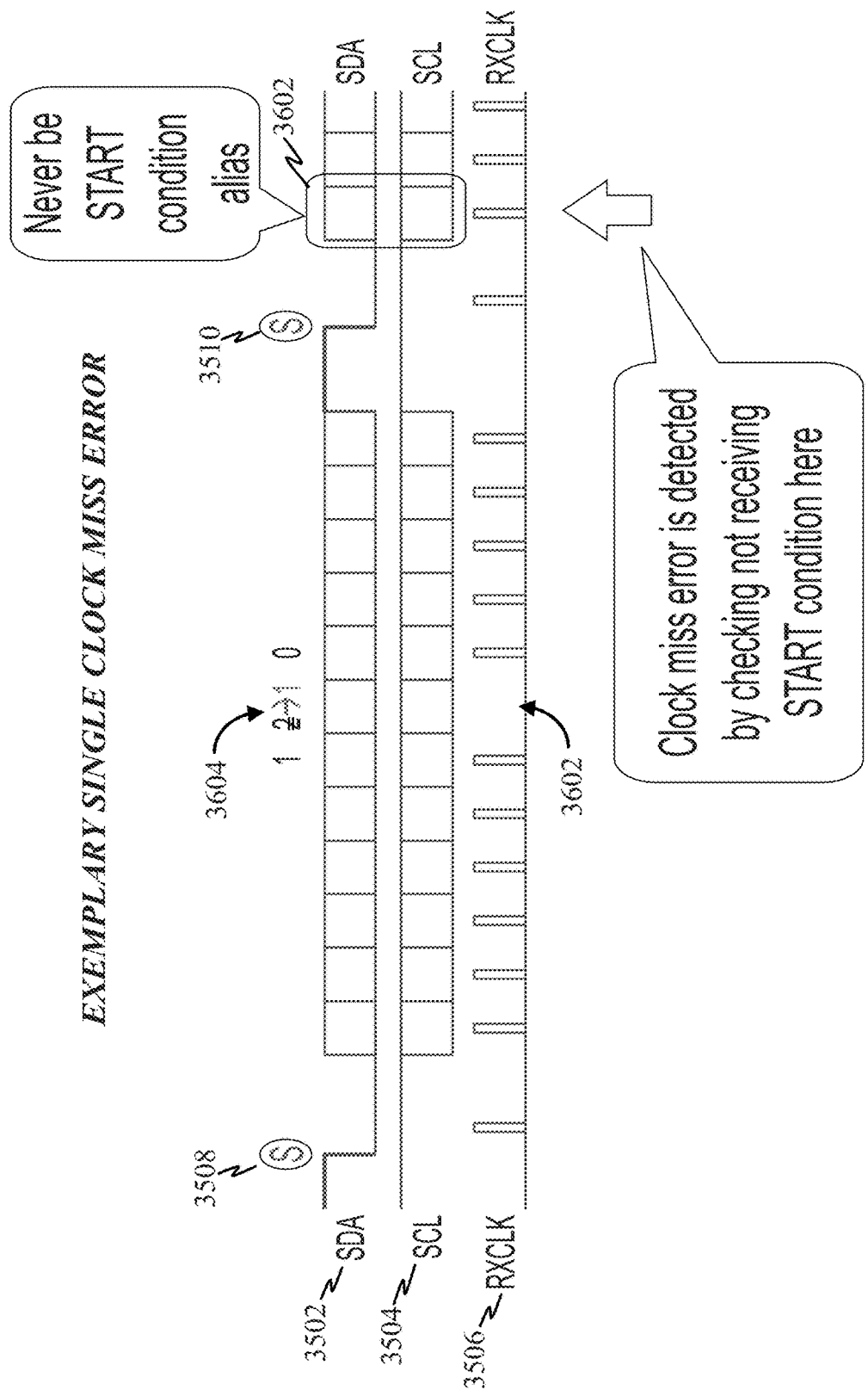

FIG. 36 illustrates an exemplary CCIe word transmission with a single clock miss error.

Figure 37:
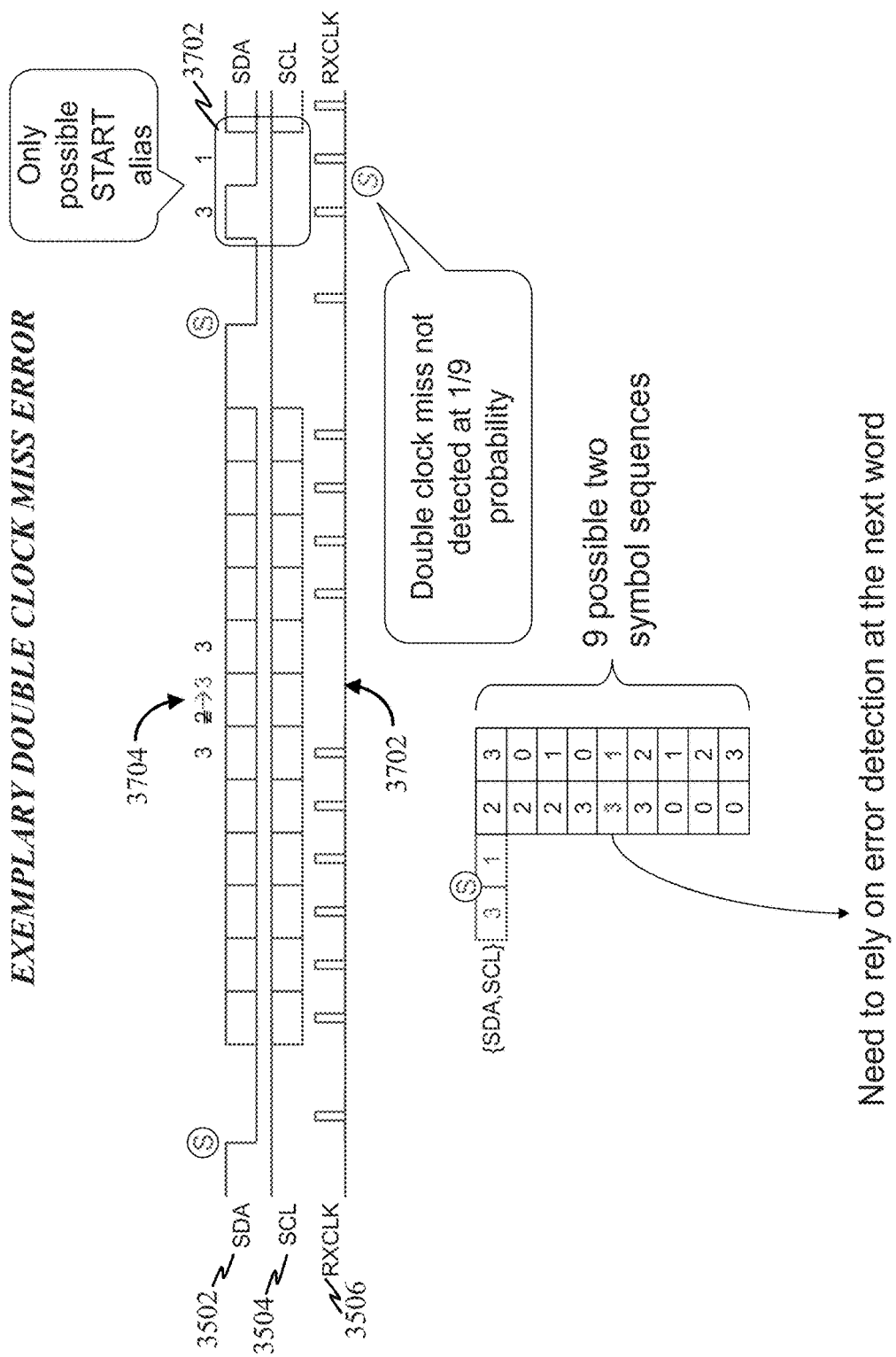

FIG. 37 illustrates an exemplary CCIe word transmission with a double clock miss error.

FIG. 38 illustrates an exemplary CCIe word transmission with an extra clock error.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures, and techniques may not be shown in detail in order not to obscure the embodiments.

Overview

An extension to CCI called CCIe (Camera Control Interface extended) has been developed that converts a binary number into a ternary number which is then transcoded to symbols embedded with a clock for transmission over a two-line I2C bus to enable higher speeds than before. The binary number is first converted into a ternary number (i.e., a base 3 number). Each digit of the ternary number is then converted into a symbol, where no two sequential symbols repeat and only a limited number of symbols (e.g., 4 symbols) are used. The symbols are then transmitted over the bus.

The use of ternary number space and conversion to symbols results in an extra bit becoming available. In one example, this extra bit may be the most significant so a region of ternary numbers become available to support other functionality not otherwise available. For instance, error detection and checksums may be facilitated due to the extra information that may be included in this extra bit.

According to one aspect, a least significant bit with each transmitted word (e.g., 20-bit word) may be used to detect approximately half the errors that may occur during transmission.

According to a second aspect, a flexible checksum word is added to a communication protocol to detect errors in transmissions. The checksum word may be inserted at any arbitrary point in the transmissions.

According to a third aspect, bits within a word are arranged such that the 3 least significant bits are available for error detection over the whole word.

According to a fourth aspect, a receiver device may maintain a state machine logic circuit that helps detect missing clock pulses and extra clock pulses within a clock signal embedded in symbol-to-symbol transitions of CCIe words in order to detect errors.

Exemplary Operating Environment

Figure 1:
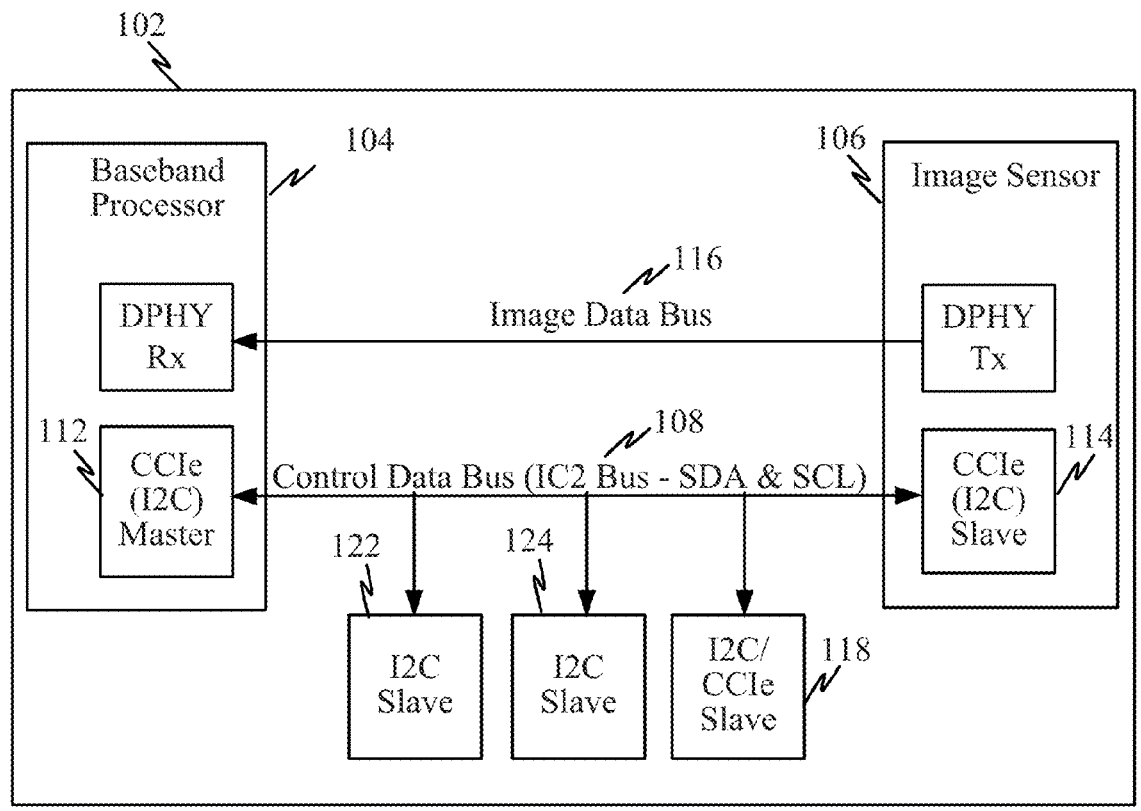
FIG. 1 is a block diagram illustrating a device having a baseband processor and an image sensor and implementing an image data bus and a multi-mode control data bus.

FIG. 1 is a block diagram illustrating a device 102 having a baseband processor 104 and an image sensor 106 and implementing an image data bus 116 and a multi-mode control data bus 108. While FIG. 1 illustrates the multi-mode control data bus 108 within a camera device, it should be clear that this control data bus 108 may be implemented in various different devices and/or systems. Image data may be sent from the image sensor 106 to the baseband processor 104 over an image data bus 116 (e.g., a high speed differential DPHY link).

In one example, the control data bus 108 may be an I2C bus comprising two wires, a clock line (SCL) and a serial data line (SDA). The clock line SCL may be used to send a clock used to synchronize all data transfers over the I2C bus (control data bus 108). The data line SDA and clock line SCL are coupled to all devices 112, 114, and 118 on the I2C bus (control data bus 108). In this example, control data may be exchanged between the baseband processor 104 and the image sensor 106 as well as other peripheral devices 118, 122, and/or 124 via the control data bus 108. The standard clock (SCL) speed for I2C is up to 100 KHz. The standard clock SCL speed in I2C fast mode is up to 400 KHz, and in I2C fast mode plus (Fm+) it is up to 1 MHz. These operating modes over an I2C bus may be referred to as a camera control interface (CCI) mode when used for camera applications.

According to one aspect, an improved mode of operation (i.e., with control data bus transmission frequencies greater than 1 MHz) may be implemented over the multi-mode control data bus 108 to support camera operation. This improved mode of operation over an I2C bus may be referred to as a camera control interface extension (CCIe) mode when used for camera applications. In CCIe mode, the SCL line and the SDA line may both be used to transmit data while a clock is embedded symbol to symbol transitions over the two lines. In this example, the baseband processor 104 includes a master device 112 and the image sensor 106 includes a slave device 114, both the master device 112 and slave device 114 may operate according to the camera control interface extension (CCIe) mode over the control data bus 108 without affecting the proper operation of other legacy I2C devices coupled to the control data bus 108. According to one aspect, this improved mode over the control data bus 108 may be implemented without any bridge device between CCIe devices and legacy I2C slaves devices.

A protocol is provided that permits I2C-compatible devices and CCIe-compatible devices to be concurrently coupled to the shared control data bus 108. The control data bus 108 may dynamically switch between operating according to distinct communication protocols (e.g., I2C mode and CCIe mode). As previously noted, communications and/or access to the shared control data bus 108 is managed by the multi-mode master device 112. The master device transmits an entry call to indicate that the control data bus 108 is to switch its communication protocol from a first protocol mode (e.g., I2C mode) to a second protocol mode (e.g., CCIe mode). Similarly, the master device transmits an exit call to indicate that the control data bus 108 is to switch its communication protocol from the second protocol mode (e.g., CCIe mode) to the first protocol mode (e.g., I2C mode). The slave devices coupled to the shared bus 108 monitor for these entry and exit calls to ascertain when they may operate on the shared bus 108.

Exemplary CCIe Encoding Technique

Figure 2:
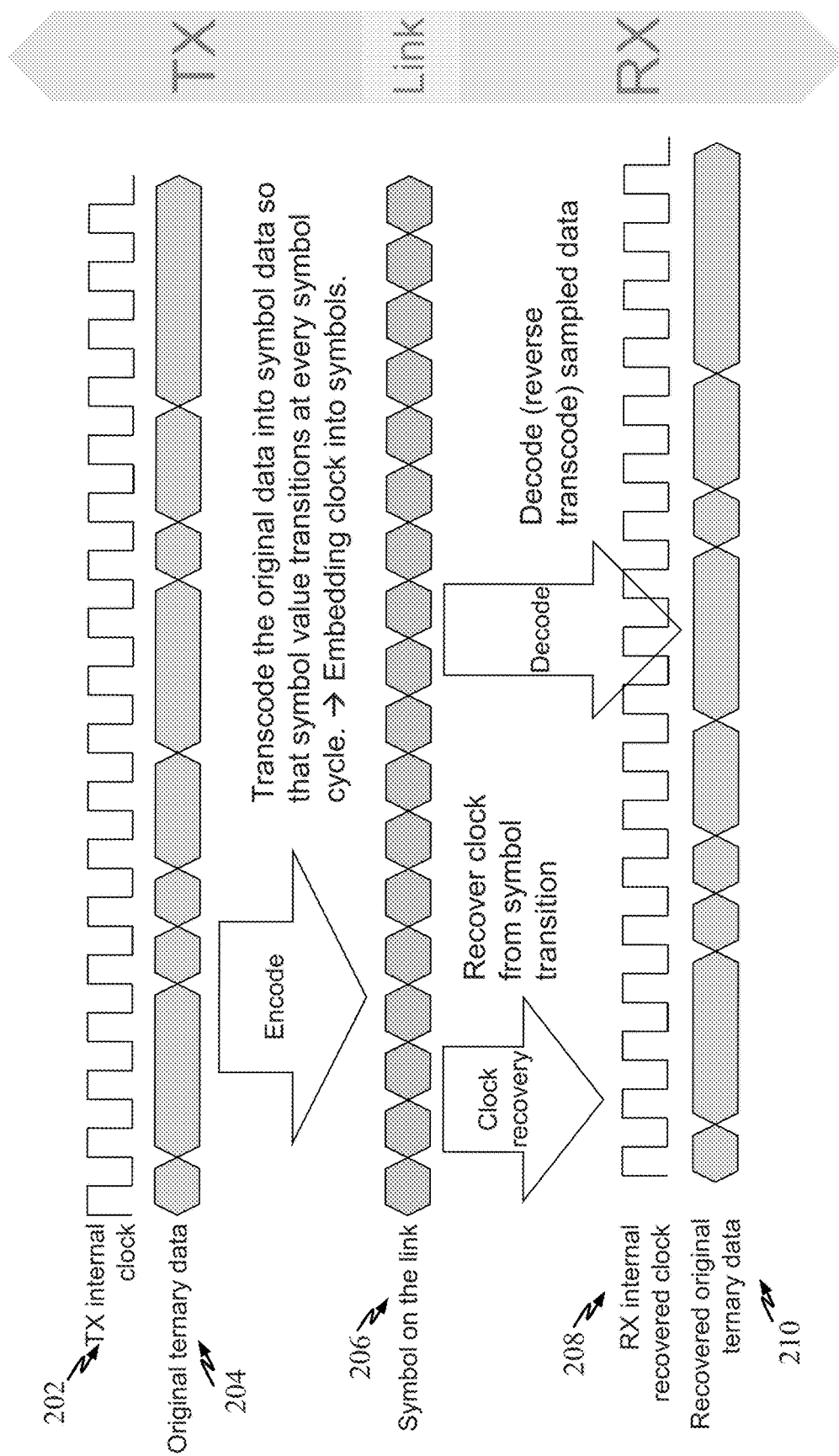
FIG. 2 illustrates how a clock may be embedded within symbol to symbol transitions in CCIe mode, thereby allowing the use of the two lines (i.e., SDA line and SCL line) in an I2C bus for data transmissions.

FIG. 2 illustrates how a clock may be embedded within symbol to symbol transitions in CCIe mode, thereby allowing the use of the two lines (i.e., SDA line and SCL line) in an I2C bus for data transmissions. In one example, this embedding of the clock may be achieved by transition clock transcoding. For instance, the data 204 to be transmitted over the physical link (wires) is transcoded so that transmitted symbols are guaranteed to change state at every symbol cycle or transition of the transmitted symbols 206. In one example, sequences of bits are converted into a ternary number, and each digit of the ternary number is converted into a symbol for transmission. Sequential symbols are guaranteed to be different even when two sequential digits of the ternary number are the same. Consequently, the original clock 202 can be embedded in the change of symbol states at every symbol cycle. A receiver recovers clock information 208 from the state transition at each symbol (in the transmitted symbols 206) and then reverses the transcoding of the transmitted symbols 206 to obtain the original data 210. In one example, each symbol is converted into a digit, a plurality of digits making up a ternary number, where the ternary number is then converted into a plurality of bits. Consequently, the original clock 202 can be embedded in the change of symbol states at every symbol cycle. This allows both wires of the I2C bus (control data bus 108 in FIG. 1, SDA line and SCL line) to be used to send data information. Additionally, the symbol rate can be doubled since it is no longer necessary to have a setup and hold time between clock and data signals.

Figure 3:
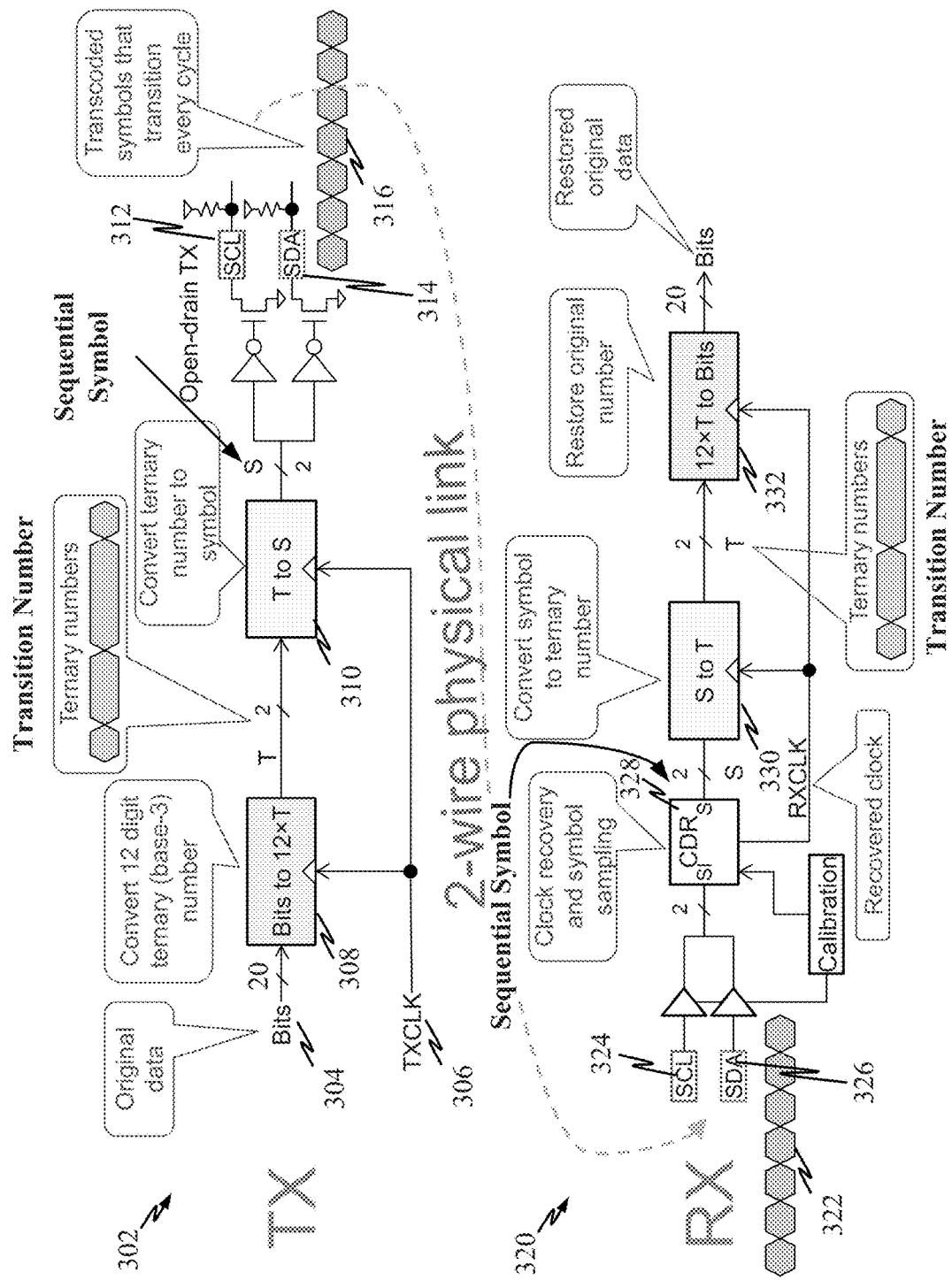
FIG. 3 is a block diagram illustrating an exemplary method for transcoding of data bits into transcoded symbols at a transmitter to embed a clock signal within the transcoded symbols.

FIG. 3 is a block diagram illustrating an exemplary method for transcoding of data bits into transcoded symbols at a transmitter to embed a clock signal within the transcoded symbols. At the transmitter 302, a sequence of data bits 304 are converted into a ternary (base 3) number (i.e., a "transition number"), and the ternary numbers are then converted into (sequential) symbols which are transmitted over the clock line SCL 312 and the data line SDA 314.

In one example, an original 20 bits of binary data is input into a bit-to-transition number converter block 308 to be converted to a 12-digit ternary number. Each digit of a 12-digit ternary number represents a "transition number". Two consecutive transition numbers may have be the same numbers (i.e., consecutive digits of the ternary number may be the same). Each transition number is converted into a sequential symbol at a transition-to-symbol block 310 such that no two consecutive sequential symbols have the same values. Because a transition is guaranteed at every sequential symbol, such sequential symbol transition may serve to embed a clock signal. Each sequential symbol 316 is then sent over a two wire physical link (e.g., I2C bus comprising a SCL line 312 and a SDA line 314).

Figure 4:
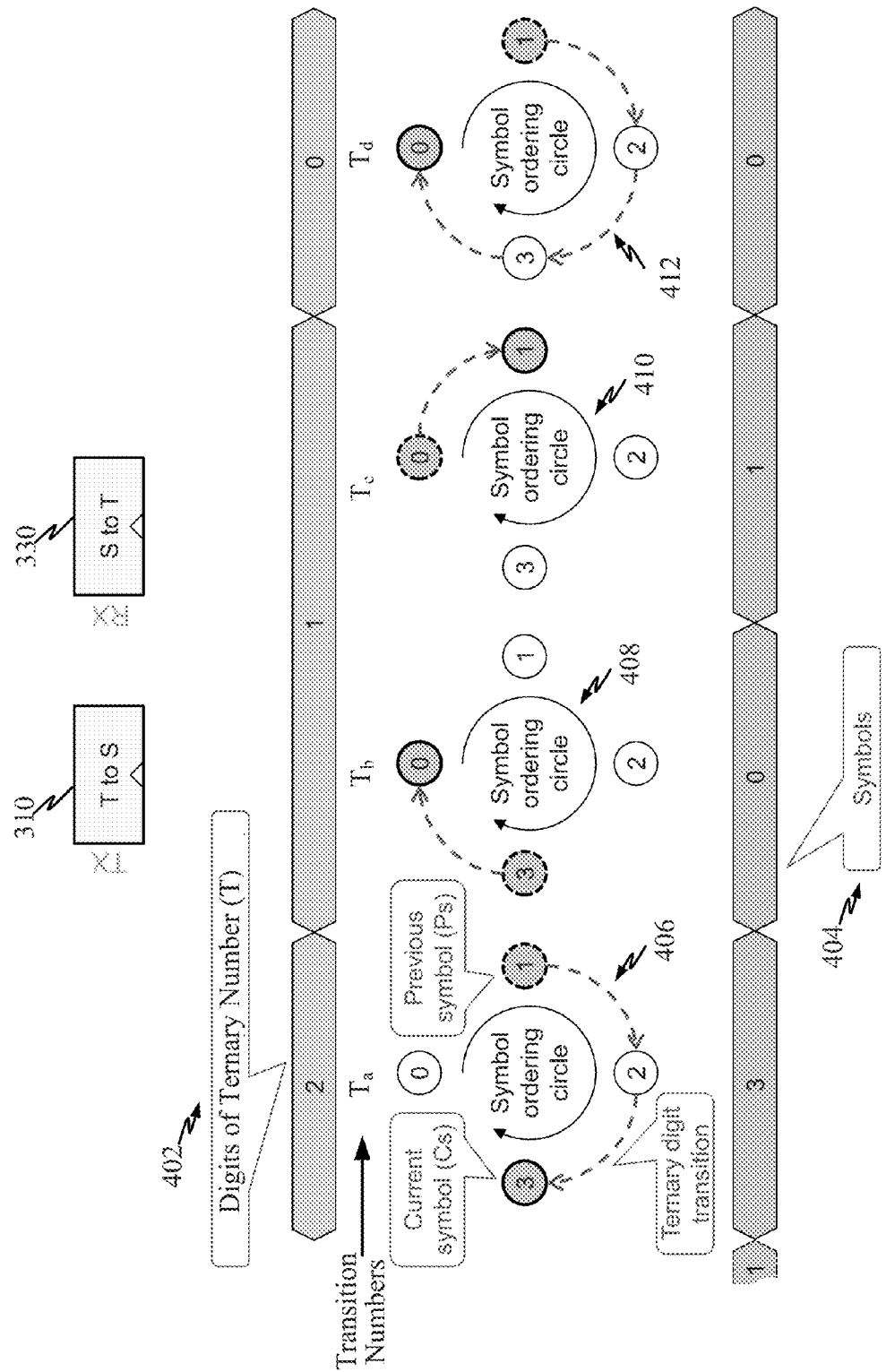
FIG. 4 illustrates an exemplary conversion between transition numbers and sequential symbols.

FIG. 4 illustrates an exemplary conversion between transition numbers 402 and sequential symbols 404. An individual digit of ternary number, base-3 number, also referred to as a transition number, can have one of the three (3) possible digits or states, 0, 1, or 2. While the same digit may appear in two consecutive digits of the ternary number, no two consecutive sequential symbols have the same value. The conversion between a transition number and a sequential symbol guarantees that the sequential symbol always changes (from sequential symbol to sequential symbol) even if consecutive transition numbers are the same.

The conversion function is set forth illustratively in FIG. 5. On the transmitter side (TX: T to S) 502, a transition number (T) may be converted to a sequential symbol (S). For instance, a current sequential symbol (Cs) may be obtained based on a previous sequential symbol (Ps) and a temporary transition number ($T_{tmp}$) that is a function of a current transition number (T). The temporary transition number ($T_{tmp}$) may be obtained by comparing the current transition number T to zero and when T=zero, the temporary transition number ($T_{tmp}$) becomes equal to 3, else (when T not equal zero) $T_{tmp}$ becomes equal to T (i.e., $T_{tmp}$=T=0?3:T). The current sequential symbol may be obtained as a sum of the current sequential symbol ($C_s$) plus the previous sequential symbol ($P_s$) plus the temporary transition number ($T_{tmp}$) (i.e., $C_s=P_s+T_{tmp}$).

On the receiver side (RX: S to T) 504 the conversion operation is reversed to obtain a transition number from a current sequential symbol (Cs) and a previous sequential symbol (Ps). A temporary transition number ($T_{tmp}$) may be obtained as the sum of the current sequential symbol (Cs) plus 4 minus the previous symbol (Ps) (i.e., $T_{tmp}=C_s+4-P_s$). The current transition number (T) is equal to the temporary transition number ($T_{tmp}$), but the temporary transition number ($T_{tmp}$) is compared to three (3) and when $T_{tmp}$=3, the temporary transition number ($T_{tmp}$) becomes equal to zero (0), else (when $T_{tmp}$ not equal 3) T becomes equal to $T_{tmp}$ (i.e., T=$T_{tmp}$=3?0:T).

A table 506 illustrates the conversion between transition numbers and sequential symbols.

Referring again to FIG. 4, an example of the conversion between transition numbers and sequential symbols is illustrated therein. For example, in a first cycle 406, the current transition number (Ta) is 2, so $T_{tmp}$ is also 2, and with the previous sequential symbol $P_s$ being 1, the new current sequential symbol $C_s$ is now 3.

In a second cycle 408, the transition number (Tb) is 1. Since the transition number (Tb) is not equal to zero, the temporary transition number $T_{tmp}$ is equal to the transition number (Tb) value of 1. The current sequential symbol (Cs) is obtained by adding the previous sequential symbol (Ps) value of 3 to the temporary transition number $T_{tmp}$ of 1. Since the result of the addition operation equals 4, which is greater than 3, the rolled over number 0 becomes the current sequential symbol (Cs).

In a third cycle 410, the current transition number (T) is 1. Because the transition number T is 1, the temporary transition number $T_{tmp}$ is also 1. The current sequential symbol (Cs) is obtained by adding the previous sequential symbol (Ps) value of 0 to the temporary transition number $T_{tmp}$ of 1. Since the result of the addition operation equals 1, which is not greater than 3, the current symbol (Cs) is equal to 1.

In a fourth cycle 412, current transition number (T) is 0. Because the transition number T is 0, the temporary transition number $T_{tmp}$ is 3.

The current sequential symbol (Cs) is obtained by adding the previous sequential symbol (Ps) value of 1 to the temporary transition number $T_{tmp}$ of 3. Since the result of the addition operation is 4, which is greater than 3, the rolled over number 0 becomes the current sequential symbol (Cs).

Note that even if two consecutive ternary digits Tb and Tc have the same numbers, this conversion guarantees that two consecutive sequential symbols have different state values. Because of this, the guaranteed transition in the sequential symbols 404 may serve to embed a clock signal, thereby freeing the clock line SCL in an I2C bus for data transmissions.

Referring again to FIG. 3, at the receiver 320 the process is reversed to convert the transcoded symbols back to bits and, in the process, a clock signal is extracted from the symbol transition. The receiver 320 receives a sequence of sequential symbols 322 over the two wire physical link (e.g., I2C bus comprising a SCL line 324 and a SDA line 326). The received sequential symbols 322 are input into a clock-data recovery (CDR) block 328 to recover a clock timing and sample the transcoded symbols (S). A symbol-to-transition number converter block 330 then converts the transcoded (sequential) symbols to a transition number, i.e., one ternary digit number. Then, a transition number-to-bits converter 332 converts 12 transition numbers to restore 20 bits of original data from the 12 digit ternary number.

The example illustrated in FIGS. 3 and 4 for a 2-wire bus and 12 transition numbers may be generalized to an n-wire system and m transition numbers. If there are r possible symbol transition states per one T, T0 to Tm−1, m transitions can send $r^m$ different states, i.e., $r=2^n-1$. Consequently, transitions T0 . . . Tm−1 contain data that can have $(2^n-1)^m$ different states.

This technique illustrated herein may be used to increase the link rate of a control bus 108 (FIG. 1) beyond what the I2C standard bus provides and is referred hereto as CCIe mode. In one example, a master device and/or a slave device coupled to the control data bus 108 may implement transmitters and/or receivers that embed a clock signal within symbol transmissions (as illustrated in FIGS. 2, 3, 4, and 5) in order to achieve higher bit rates over the same control data bus than is possible using a standard I2C bus.

Figure 6:
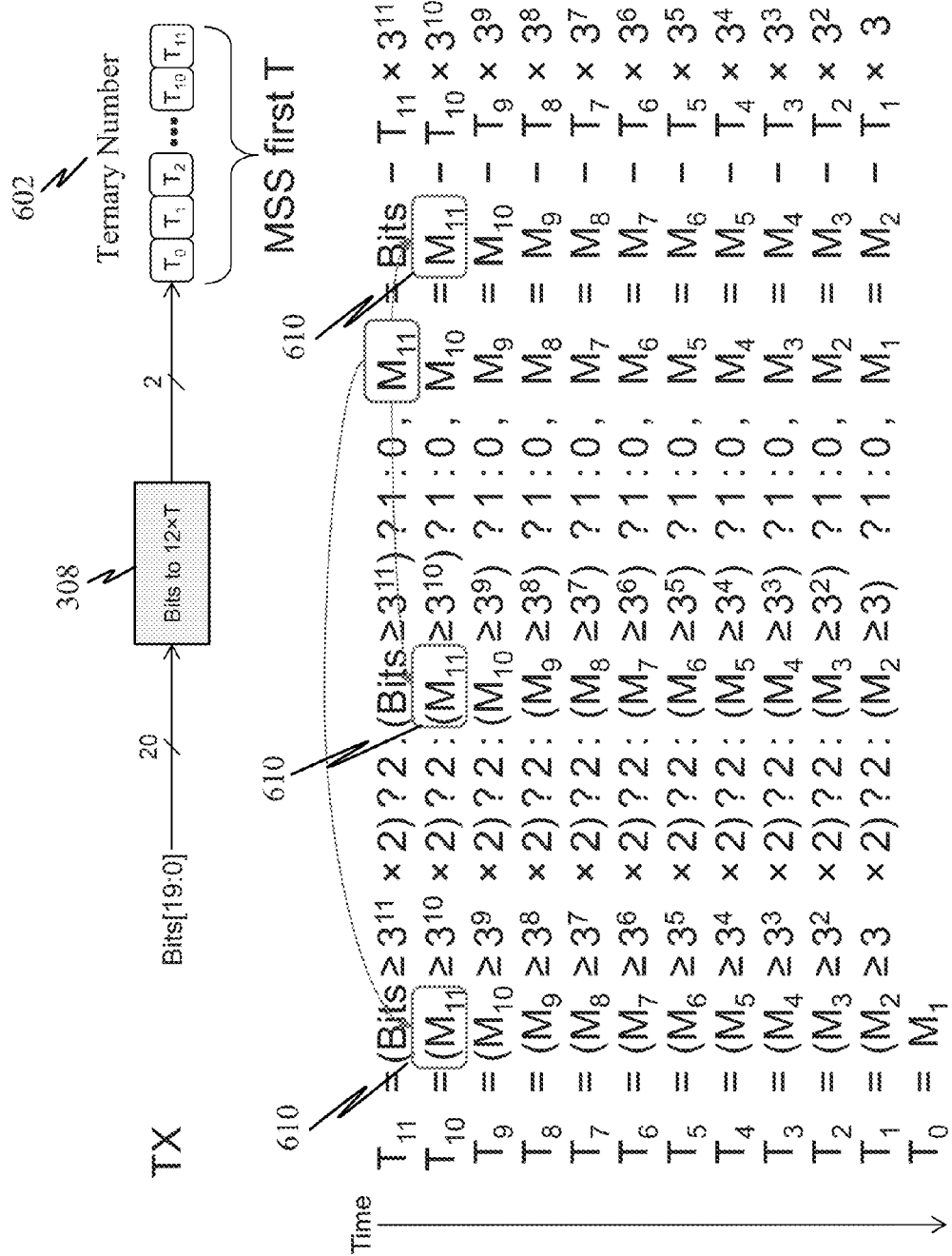
FIG. 6 illustrates a method for converting binary bits into ternary numbers from most significant bit to least significant bit.

FIG. 6 illustrates a method for converting binary bits into ternary numbers from most significant bit to least significant bit. Each digit of a ternary number may be transcoded (converted) into symbols that are transmitted to a receiving device. For a 12 digit ternary number 602 with T0, T1 . . . T11 representing the ternary number, T0 represents the $3^0$ digit (and is the least significant digit) while T11 represents the $3^{11}$ digit (and is the most significant digit). Starting with the received bits (e.g., 20 bit sequence), the most significant digit T11 of the ternary number 602 is obtained first. Then, the next most significant digit T10 is obtained next. This process continues until the least significant digit T0 is obtained. Each of the digit of the ternary number 602 may also referred to as a "transition number".

Figure 7:
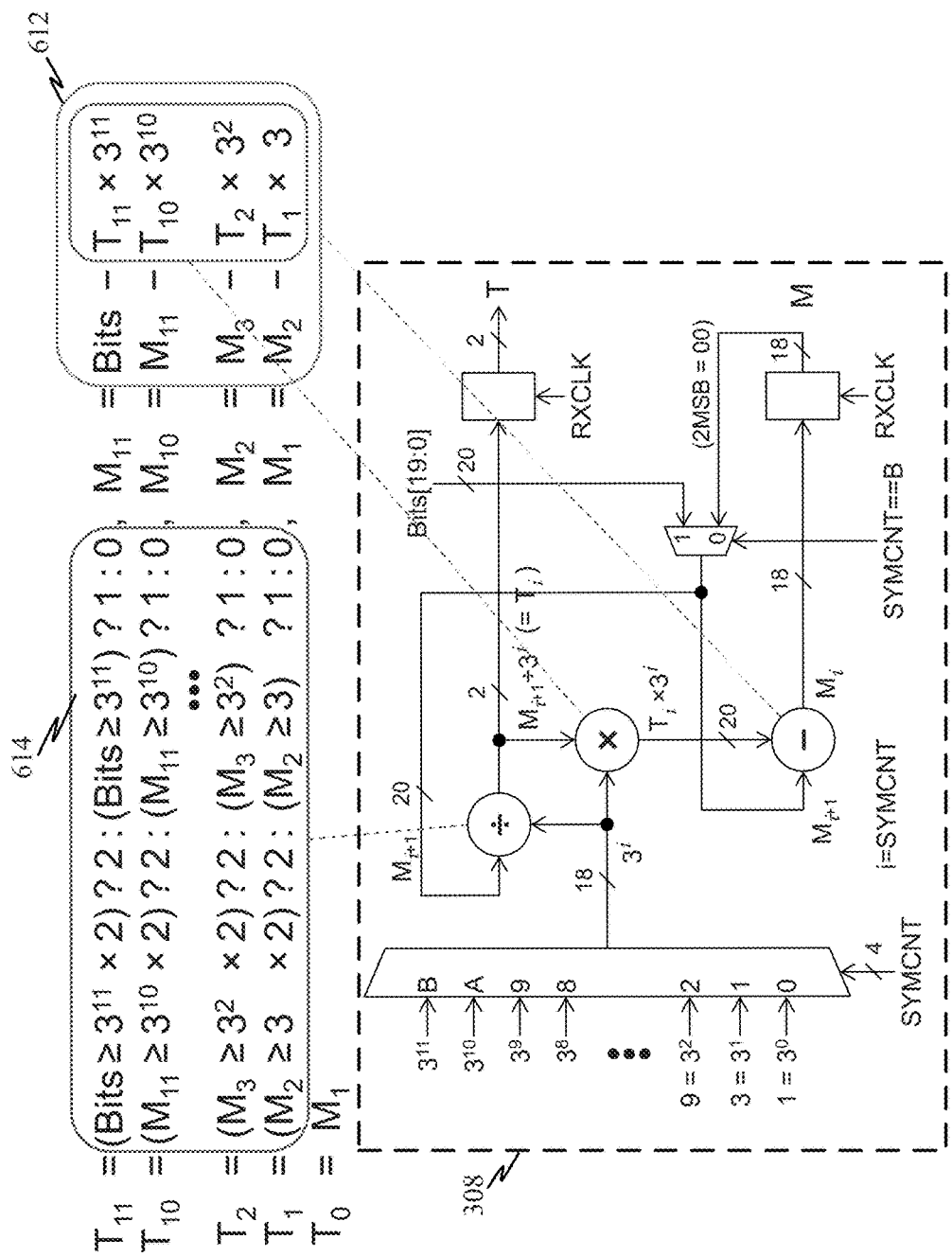
FIG. 7 illustrates a transmitter-side logic circuit for converting binary bits into ternary numbers from most significant bit to least significant bit.

FIG. 7 illustrates a transmitter-side logic circuit for converting binary bits into ternary numbers from most significant bit to least significant bit. FIGS. 6 and 7 illustrate the 12 digit ternary number 602 being sent in order of T11, T10, T9, . . . , T0. By obtaining and sending the most significant bit first, the logic and circuitry involved is simplified in complexity. In the approach in FIGS. 6 and 7, the most significant sequential symbol is transmitted to the receiving device first, and is therefore called MSS first (most significant symbol first). As used herein "least significant symbol" refers to the transcoded symbol corresponding to the least significant digit of the ternary number 602. For example and with reference to the description of FIGS. 4 and 5, when T0 is transcoded into a sequential symbol that is the least significant symbol because it originated from the least significant ternary digit. Similarly, as used herein "most significant symbol" refers to the transcoded symbol corresponding to the most significant digit of the ternary number 602. For example and with reference to the description of FIGS. 4 and 5, when T11 is transcoded into a sequential symbol that is the most significant symbol because it originated from the most significant ternary digit. And when the symbol-to-transition number converter block 330 (FIG. 3) subsequently receives and converts the transcoded (sequential) symbol to a transition number, i.e., a digit of a ternary number it will be the most significant digit T11 first, and least significant digit T0 last.

Referring back to FIG. 3, the original data of twenty bits is converted into a ternary number in reverse order (i.e., the most significant bit is supplied to a converter first), then each digit of the ternary number (e.g., each transition number) is converted (i.e., transcoded) to a sequential symbol in reverse order, and these transcoded symbols are transmitted on the bus in reverse order (i.e., most significant symbol first).

Figure 8:
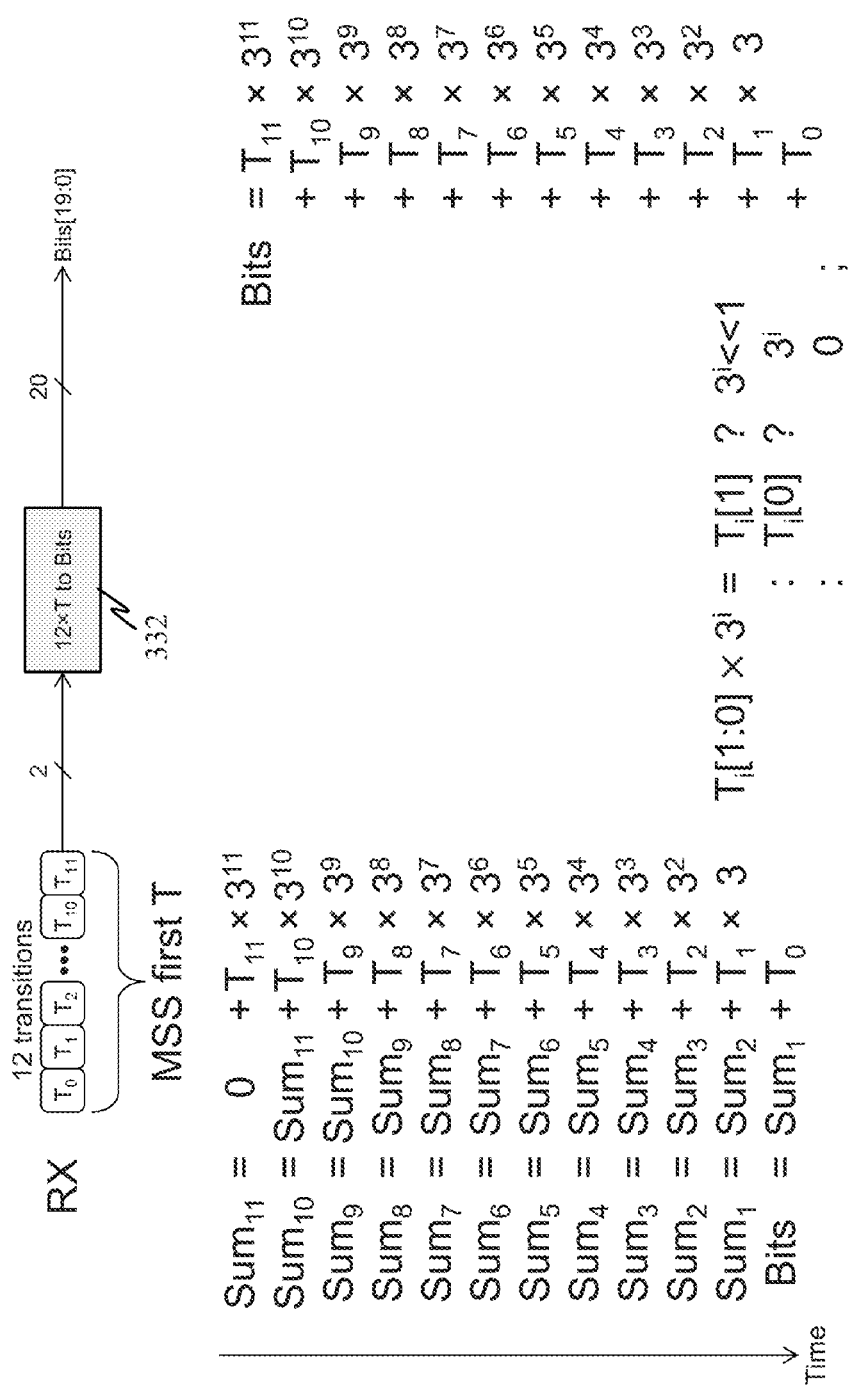
FIG. 8 illustrates a method for converting ternary numbers into binary bits from most significant bit to least significant bit.

FIG. 8 illustrates a method for converting ternary numbers into binary bits from most significant bit to least significant bit. That is, this receiver-side conversion reverses the operations performed in the transmitter-side conversion illustrated in FIGS. 6 and 7. A receiving device (e.g., a slave device) receives the reverse order transmission and performs clock recovery and symbol sampling to convert the transcoded symbols back to a ternary number which is then supplied in reverse order to the logic circuit in FIG. 9 which converts the ternary number back to the 20 bit binary original data. FIG. 7 illustrates a multiplexer with twelve inputs coupled to a single output to a logic device.

Figure 9:
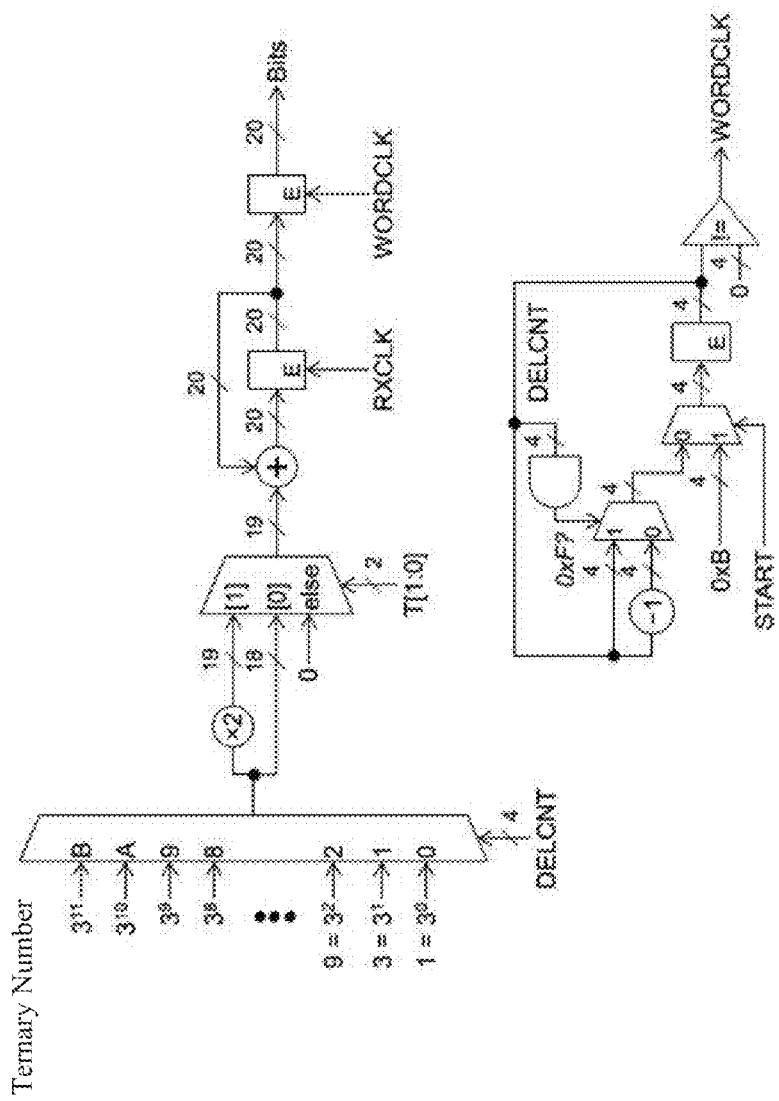
FIG. 9 illustrates a receiver-side logic circuit for converting a twelve digit ternary number into twenty bits.

FIG. 9 illustrates a receiver-side logic circuit for converting a twelve digit ternary number into twenty bits.

FIG. 10 conceptually illustrates a bit 19 (i.e., the 20$^{th}$ bit when the bit count starts at the first bit being bit 0) is mostly unused in the CCIe protocol and may be used for commands between devices on the shared bus. That is, as a result of the encoding scheme illustrated in FIGS. 3-9, an extra bit (i.e., bit 19) is now available in the transmitted symbols. More specifically, FIG. 10 illustrates the bit 19 (i.e., the 20$^{th}$ bit). In other words, as is typical in the computer sciences, counting bit wise begins at zero, and bit 19 is the 20$^{th}$ bit. Here, the bits 0-18 are represented within the ternary number range of 0000_0000_0000$_3$ to 2221_2201_2001$_3$. The ternary numbers in the range of 2221_2201_2002$_3$ to 2222_2222_2222$_3$ are unused. Consequently, the ternary number range 2221_2201_2002$_3$ to 2222_2222_2222$_3$ may be used to represent bit 19 (i.e., 20$^{th}$ bit). In other words, 2221,2201,2002$_3$ ternary is 10,000,000,000,000,000,000 binary (0x80000 hexadecimal) and 2222_2222_2222$_3$ ternary (0x81BF0) is the largest 12 digit ternary number possible.

Exemplary Protocol for CCIe Mode

FIG. 11 illustrates an exemplary general call for CCIe mode entry indicator that may be sent by a master device over a shared bus to indicate to slave devices that the shared bus is switching to operate from I2C mode to CCIe mode. The general call 1102 may be issued by an I2C master device over the shared bus (e.g., master device 112 in FIG. 1 while in I2C mode over SDA line and SCL line) to indicate a transition from I2C mode to CCIe mode to all I2C-compatible devices.

In I2C mode, the CCIe master device issues this I2C general call 1102 with a "CCIe mode" byte or indicator 1104. The CCIe-compatible slave devices acknowledge receipt of the general call 1102. CCIe-compatible slave devices can insert wait cycles by holding the SCL line (of the control data bus 108) low during the general call if necessary.

Once in CCIe mode, all CCIe-compatible devices are able to respond to requests from the CCIe master device. Operational states or any functionalities of legacy I2C-compatible slave devices on the shared control data bus that do not support CCIe mode are not be affected by any CCIe transactions.

FIG. 12 illustrates an exemplary CCIe call 1202 that may be issued by a CCIe master device (e.g., master 112 in FIG. 1 while in I2C mode) to indicate a transition from CCIe mode to I2C mode to all CCIe able devices. The CCIe master device may issue this exit call 1202 in place of CCIe SID.

In CCIe mode, after the last data in CCIe mode followed by S, the CCIe master sends special CCIe SID code, "Exit" code/indicator 1204, to indicate (e.g., to CCIe-compatible devices) the end of CCIe mode and transition back to I2C mode. Additionally, after the "exit" code/indicator 1204, the CCIe master device sends S (start-bit) followed by "general call" 1206, according to the I2C protocol, with an "exit" code 1208 at the 2nd byte within I2C protocol. All CCIe capable slaves must acknowledge to the general call 1204.

FIG. 13 illustrates an exemplary CCIe slave identifier (SID) word format. This illustrates the use of a 16-bit slave identifier (SID) 1304 as part of the CCIe SID word format 1302. Such SID word format would be used to identify a particular slave device when the word is place on the control data bus.

FIG. 14 illustrates an exemplary CCIe address word format 1402. This illustrates that each address word 1406 includes a 16-bit address 1404. The address word 1406 also includes a 2-bit control code 1408 and a 1-bit error detection constant 1410. The table 1412 illustrates various possible values for the control code.

Multiple address words may be sent sequentially. If the current control word is '00', this means an address word will follow. If the control code is '01', the next data word is a write data word. If the control code is '01', the next data word is one word read data word. The control code is '11' is prohibited.

FIG. 15 illustrates an exemplary write data word format 1502. This illustrates that each data word 1500 includes a 16-bit write data portion 1502. The write data word 1500 also includes a 2-bit control code 1504, and 1-bit error detection constant 1510. The table 1514 illustrates various possible values for the control code.

Multiple write data words can be sent sequentially. If the control code of the current write word is '00' (symbol C0), then the data is to be written to the previous address. If the control code of the current write word is '01' (symbol C0, then the data is to be written to the previous address+1. If the control code is '10' (symbol E), the next word will be a SID or an Exit code.

FIG. 16 illustrates an exemplary read specification word format 1600. The read specification data word 1600 may include a 16-bit read data value portion 1604, a 2-bit control code 1608, and 3-bit error detection constant 1610.

After the last address word 1607, a "read spec" (RS) word 1612 follows. The read spec (RS) word 1612 specifies the number of read data words that follows. As illustrated in the table 1616, the control code '00' is used to indicate a read word from the same address. The control code '01' is use to indicate a read words from incremental address. The slave device (from where the data is being read) shall not send more data words (not including CHK words) than specified by the "read spec" (RS) word 1604. The slave device shall send at least one read word (not including CHK word). The slave device may end a read transfer before sending the number of words specified by the "read spec" (RS) 1604 word.

FIG. 17 illustrates an exemplary read data word format 1702. The read data word 1702 may include a 16-bit read data value portion 1704, a 2-bit control code 1706, and 1-bit error detection constant 1708. A slave device addressed by the SID 1707 determines the number of words to return to a requesting master device. As illustrated in table 1716, the control code is "00" (symbol R0) if the read word continues from the same address. Control code is "01" (symbol R1) if the read word continues from an incremental address. The control code is "10" (symbol E) if the word is the last read word and there's no CHK after that. Control code is "00" is prohibited.

Exemplary I2C Transmissions Versus CCIe Transmissions Over Shared Bus

FIG. 18 illustrates an exemplary timing diagram of an I2C one byte write data operation. In this example, the shared control data bus 108 (FIG. 1) includes a serial data line SDA 1802 and a serial clock line SCL 1804. The transmission scheme illustrated in FIG. 18 may be referred to as "I2C mode". The SCL line 1804 is used to send a clock from the master device to all slave devices while the SDA line 1802 transmits data bits. An I2C master device sends a 7-bit slave ID 1808 in the SDA line 1802 to indicate which slave device on the I2C bus the master device wishes to access, then one bit to indicate a write operation. Only the slave device whose ID matches with the 7-bit slave ID 1808 can cause intended actions. In order for an I2C slave device to detect its own ID, the master device has to send at least 8-bits on the SDA line (or 8 clock pulses on the SCL line 2204).

The I2C standard requires that all I2C compatible slave devices reset their bus logic on receipt of a START condition 1806 (e.g., indicated by a high-to-low transition on the SDA line while the SCL line is high).

The CCIe protocol uses both the SDA line 1802 and the SCL line 1804 for data transmissions while embedding a clock signal within the data transmissions. For example, data bits may be transcoded into a plurality of symbols which are then transmitted over lines. By embedding the clock signal (SCL line for I2C bus in FIG. 18) within symbol transitions, both the SDA line 1802 and SCL line 1804 may be used for data transmission.

FIG. 19 illustrates an exemplary CCIe transmission in which data bits have be transcoded into twelve symbols for transmission over the SDA line 1902 and the SCL line 1904. The transmission scheme illustrated in FIG. 19 may be referred to as "CCIe mode". CCIe mode is source synchronous, driven by push-pull drivers. Whoever sends out data over the shared control data bus also sends out clock information embedded in the data (e.g., within the symbol-to-symbol transitions). Consequently, only one device on the control data bus is allowed to drive the share control data bus at any one time.

In order to support both legacy I2C devices and CCIe devices over the same bus, CCIe mode operations use the same START condition 1906, 1908, 1910, which prevents legacy I2C slave devices from reacting to any CCIe operations (e.g., the Start condition during CCIe mode causes the legacy I2C slave devices to reset). In this example, the START condition 1906, 1908, 1910 (i.e., indicated by a high to low transition on the SDA line 1902 while the SCL line 1904 is high) is detected before a full slave ID (i.e., a full 7 bits) is transmitted, therefore this is an incomplete slave ID (less than 7 bits). If a master device sends 6 SCL pulses then issues a START condition 1906, 1908, 1910, then all legacy I2C slave devices reset their bus logic before they recognize the data as an I2C Slave ID. Since the 6-bit sequences (e.g., corresponding to every two symbols) are sent between two START conditions 1906, 1908, 1910, these 6-bit sequences are not decoded as a valid slave ID by any I2C slave device. Consequently, legacy I2C slave devices will not act upon the incomplete Slave IDs.

In this system, the master device controls access to the bus. So, any device that wishes to transmit over the control data bus must request such access from the master device, for example, by issuing an interrupt request. Prior art mechanisms for issuing interrupts have relied on dedicated interrupts lines or a dedicated interrupt bus. However, such dedicated interrupt lines or bus means that the devices must include at least one additional pin to accommodate such interrupt line or bus. In order to eliminate the need for such dedicated interrupt pin and lines/bus, a mechanism for in-band interrupts within CCIe is needed.

The use of in-band interrupts should also avoid bus contention or collisions. For example, to avoid collisions, a slave device should not be allowed to drive the control data bus (e.g., either SDA line 1802 or SCL line 1904) to assert an IRQ while the master device is driving the control data bus.

Exemplary Bit 19 Region and Checksum

FIG. 20 illustrates an exemplary mapping of the $20^{th}$ bit (bit 19) resulting from the encoding scheme illustrated in FIGS. 2-10. As can be appreciated, the ternary numbers available may serve to expand the features and capabilities between master devices and slave devices. For example, this ternary number space available within bit 19 (i.e., the data region whose bit 19 is '1') may serve to facilitate or indicate: (a) slave-to-slave transmissions, (b) checksums for transmissions, (c) master operation handover to slave devices, (d) a heartbeat clock, etc.

FIG. 21 illustrates details of a sub-region within the exemplary mapping of the $20^{th}$ bit (bit 19) region of FIG. 20.

FIG. 22 illustrates various symbol error conditions that may occur. The timing diagram 2202 illustrates a correct transmission over a control data bus (SDA line and SCL line) and the receiver clock (RXCLK).

A clock miss 2204 is illustrated where the receiver clock (RXCLK) misses two cycles 2212 and 2214 such that a data bit 2210 is incorrectly detected. If there are more following words in the same transfer direction, word data errors are most likely detected in following the words. Synchronization (SYNC) loss may also be detected. If the error occurs on the last word, the master device needs timeout detection functionality.

An extra clock 2206 is illustrated where the receiver clock (RXCLK) has an extra symbol '01' 2216 and 2218 detected at the extra clock cycle 2220. This error is most likely detected in the word or following words. Synchronization loss may also be detected.

A symbol error 2208 is illustrated where there are no receiver clock (RXCLK) misses but a single symbol error 2222 occurs. This error is most likely detected in the word or following words. A checksum error is most likely detected.

Exemplary Error Detection within Transmitted Symbols

FIGS. 23-28 illustrate various symbol error conditions (i.e., single symbol error without a symbol slip) that may occur for various CCIe words. As shown, these errors may be detected by using three bits (bits 0, 1, and 2), as discussed further below. These examples use the three (3) least significant bits (Bits [2:0]) for error detection.

FIG. 23 illustrates a table 2300 showing the possible errors in the transmitted symbol sequence 0321_0321_0321 and how such errors are detectable within the three least significant bits. A twenty bit sequence of (Bits [19:0]) 0000_0000_0000_0000_0000 2302 is converted into a ternary number (T11 . . . T0) 0000_0000_0000$_3$ 2304 which is then converted to sequential symbols (S11 . . . S0) 0321_0321_0321 2306 by using the method illustrated in FIGS. 3, 4, 5, 6, 7 and 8. For purposes of this example, the three least significant bits 2308 are all zero (000). If an error is introduced during transmission at any of the symbols of the original sequential symbols 0321_0321_0321 2306, these results in erroneous symbols 2310. For example, if the last symbol "1" is changed to "0", this results in a change of the three least significant bits from "000" to "010". If the last symbol "1" is changed to "3", this results in a change of the three least significant bits from "000" to "001". If the first symbol of "0" is changed to "2", this results in a change of the three least significant bits from "000" to "100". The table 2300 illustrates various other examples of how a change of any single symbol is detectable by the three (3) least significant bits, so long as the least three significant bits are a known constant (e.g., a fixed constant of "000").

FIG. 24 illustrates a table 2400 showing the possible errors in the transmitted symbol sequence 2301_2301_2301 and how such errors are detectable within the three least significant bits. A twenty bit sequence of (Bits [19:0]) 0100_0000_1101_1111_1000 2402 is converted into a ternary number (T11 . . . T0) 1111_1111_1111$_3$ 2404 which is then converted to sequential symbols (S11 . . . S0) 2301_2301_2301 2406 by using the method illustrated in FIGS. 3, 4, 5, 6, 7 and 8. For purposes of this example, the three least significant bits 2408 are all zero (000). If an error is introduced during transmission at any of the symbols of the original sequential symbols 2301_2301_2301 2406, these results in erroneous symbols 2410. For example, if the last symbol "1" is changed to "3", this results in a change of the three least significant bits from "000" to "111". If the last symbol "1" is changed to "2", this results in a change of the three least significant bits from "000" to "001". If the first symbol of "2" is changed to "0", this results in a change of the three least significant bits from "000" to "100". The table 2400 illustrates various other examples of how a change of any single symbol is detectable by the three (3) least significant bits, so long as the least three significant bits are a known constant (e.g., a fixed constant of "000").

FIG. 25 illustrates a table 2500 showing the possible errors in the transmitted symbol sequence 3131_3131_3131 and how such errors are detectable within the three least significant bits. A twenty bit sequence of (Bits [19:0]) 1000_0001_1011_1111_0000 2502 is converted into a ternary number (T11 . . . T0) 2222_2222_2222$_3$ 2504 which is then converted to sequential symbols (S11 . . . S0) 3131_3131_3131 2506 by using the method illustrated in FIGS. 3, 4, 5, 6, 7 and 8. For purposes of this example, the three least significant bits 2508 are all zero (000). If an error is introduced during transmission at any of the symbols of the original sequential symbols 3131_3131_3131 2406, these results in erroneous symbols 2510. For example, if the last symbol "1" is changed to "0", this results in a change of the three least significant bits from "000" to "111". If the last symbol "1" is changed to "2", this results in a change of the three least significant bits from "000" to "100". If the first symbol of "3" is changed to "0", this results in a change of the three least significant bits from "000" to "001". The table 2500 illustrates various other examples of how a change of any single symbol is detectable by the three (3) least significant bits, so long as the least three significant bits are a known constant (e.g., a fixed constant of "000").

FIG. 26 illustrates a table 2600 showing the possible errors in the transmitted symbol sequence 0132_3101_3231 and how such errors are detectable within the three least significant bits. A twenty bit sequence of (Bits [19:0]) 0001_1000_1111_0011_1000 2602 is converted into a ternary number (T11 . . . T0) 0120_1201_2012$_3$ 2604 which is then converted to sequential symbols (S11 . . . S0) 0132_3101_3231 2606 by using the method illustrated in FIGS. 3, 4, 5, 6, 7 and 8. For purposes of this example, the three least significant bits 2608 are all zero (000). If an error is introduced during transmission at any of the symbols of the original sequential symbols 0132_3101_3231 2606, these results in erroneous symbols 2610. For example, if the last symbol "1" is changed to "0", this results in a change of the three least significant bits from "000" to "111". If the last symbol "1" is changed to "2", this results in a change of the three least significant bits from "000" to "110". If the first symbol of "0" is changed to "3", this results in a change of the three least significant bits from "000" to "111". The table 2600 illustrates various other examples of how a change of any single symbol is detectable by the three (3) least significant bits, so long as the least three significant bits are a known constant (e.g., a fixed constant of "000").

FIG. 27 illustrates a table 2700 showing the possible errors in the transmitted symbol sequence 2030_2120_3021 and how such errors are detectable within the three least significant bits. A twenty bit sequence of (Bits [19:0]) 0100_1010_1101_1010_1000 2702 is converted into a ternary number (T11 . . . T0) 1201_2012_0120$_3$ 2704 which is then converted to sequential symbols (S11 . . . S0) 2030_2120_3021 2706 by using the method illustrated in FIGS. 3, 4, 5, 6, 7 and 8. For purposes of this example, the three least significant bits 2708 are all zero (000). If an error is introduced during transmission at any of the symbols of the original sequential symbols 3231_0132_3101 2706, these results in erroneous symbols 2710. For example, if the last symbol "1" is changed to "0", this results in a change of the three least significant bits from "000" to "010". If the first symbol of "2" is changed to "0", this results in a change of the three least significant bits from "000" to "011". The table 2700 illustrates various other examples of how a change of any single symbol is detectable by the three (3) least significant bits, so long as the least three significant bits are a known constant (e.g., a fixed constant of "000").

FIG. 28 illustrates a table 2800 showing the possible errors in the transmitted symbol sequence 3231_0132_3101 and how such errors are detectable within the three least significant bits. A twenty bit sequence of (Bits [19:0]) 0101_1110_1101_0000_1000 2802 is converted into a ternary number (T11 . . . T0) 2012_0120_1201$_3$ 2804 which is then converted to sequential symbols (S11 . . . S0) 3231_0132_3101 2806 by using the method illustrated in FIGS. 3, 4, 5, 6, 7 and 8. For purposes of this example, the three least significant bits 2808 are all zero (000). If an error is introduced during transmission at any of the symbols of the original sequential symbols 3231_0132_3101 2806, these results in erroneous symbols 2810. For example, if the last symbol "1" is changed to "3", this results in a change of the three least significant bits from "000" to "111". If the first symbol of "3" is changed to "0", this results in a change of the three least significant bits from "000" to "100". The table 2800 illustrates various other examples of how a change of any single symbol is detectable by the three (3) least significant bits, so long as the least three significant bits are a known constant (e.g., a fixed constant of "000").

First Exemplary Approach to Error Detection

As noted in FIGS. 23-28, it is possible to use the three least significant bits of a 20-bit CCIe word to detect any single symbol error without a clock miss or symbol slip.

FIG. 29 illustrates how a CCIe word 2902 may use the three least significant bits 2903 or the least significant bit 2905 for error detection. For a first CCIe word 2902 (e.g., 20-bit sequence), the three least significant bits 2903 may be set to a fixed constant (e.g., "000") and errors are detected at the receiving device if the received 20-bit sequence has three least significant bits that are anything other than the fixed constant (e.g., "000"). No single symbol error without symbol slip a CCIe word (e.g., in any of the 12 symbols in the word or in any of the twenty bits (Bits[19:0] from 0x00000 to 0x81BF0 hex) is missed by using this approach, thereby providing 100% detection of any such single symbol error. However, using three (3) bits out of twenty (20) bits for error detection may be too costly for many implementations.

An alternative approach provides for using a single bit (e.g., least significant Bit 0) instead of the three least significant bit for error detection. A fixed bit 0 (e.g., fixed to "0") may be used to help detect symbol errors (without clock miss or symbol slip) in approximately half the cases. In addition to using a fixed bit 0, a checksum of bits 1 and 2 of sequential CCIe words may be computed (see FIG. 31) and sent to a receiving device to ascertain whether an error has occurred in the transmitted CCIe words.

For a second CCIe word 2904 (e.g., 20-bit sequence), the least significant bit 2905 may be set to a fixed constant (e.g., "0"). As can be appreciated from FIGS. 23-28, the least significant bit 2905 changes about half of the time when there is a symbol error in the corresponding sequence of symbols. Consequently, for errors reflected at the least significant bit, a receiving device may successfully ascertain there is an single symbol error (with no clock miss or symbol slip) in a received 20-bit sequence if the least significant bit in the sequence is anything other than the fixed constant (e.g., "0").

In addition to, or in conjunction with, using the least significant bit 2905 for error detection, a checksum message may be used to provide a high degree of error detection over a sequence of CCIe words. The only scenario in which such checksum message does not detect errors is where the effect of two symbol errors cancel out when computing the checksum.

FIG. 30 illustrates how an 8-bit checksum may be implemented within a CCIe word. In this example, a checksum word 3005 may be denoted (within a 20 bit sequence) by setting bit 19 to '1' and bit 12 to '0' while placing the checksum value within the CCIe frame for an CCIe address word 3004*a*, write word 3004*b*, and/or read word 3004*c* (e.g., Bits 4-11 of each word may be used for the checksum). The 8-bit checksum value 3003 may be calculated over several CCIe word transmissions. For instance, this checksum word 3005 may be sent at the end of a sequence of CCIe word transmissions.

This checksum word may be defined within the additional space available due to bit 19 (see FIG. 20). The checksum word 3005 may be inserted within an address or data portion of a write command 3006 and/or read command 3010. For example, in a write command 3006, one or more address words 3008*a*, 3008*b* and/or one or more write words 3008*c* and 3008*d* may be used to convey a checksum value (e.g., from a master device to a slave device). Similarly, in a read command 3010, one or more address words 3012*a*, 3012*b* and/or one or more read words 3012*c* and 2312*d* may be used to convey a checksum value.

In contrast to other checksum approaches, the present CCIe checksum word 3005 may be inserted by a sender anywhere and anytime within transmission.

FIG. 31 illustrates an exemplary implementation of an 8-bit checksum generator. The checksum generator 3102 may include a one bit register for each of the 8 bits of the checksum 3104. Bits 2 and 1 of a first CCIe word N 3110 are exclusively ORed (XOR) with the least significant bits in the checksum 3104. Then Bits 2 and 1 of a second CCIe word N+1 3112 are exclusively ORed (XOR) with the next least significant bits in the checksum 3104. Then Bits 2 and 1 of a third CCIe word N+2 3114 are exclusively ORed (XOR) with the next least significant bits in the checksum 3104. Then Bits 2 and 1 of a fourth CCIe word N+3 3116 are exclusively ORed (XOR) with the most significant bits in the checksum 3104. After reaching the most significant bits of the checksum value 3104, on the next CCIe Word N+4 the checksum generator may start again at the two least significant bits of the checksum 3104.

In this manner, contributions from different CCIe words are propagate their use across the 8-bit checksum. The 1-bit registers may be initialized at every beginning of a transfer (e.g., before an SID, and/or before the start of read word). To implement the CCIe checksum word, the transmitting device may compute the checksum value as each CCIe word is sent. At the receiver device, a checksum value is also computed in the same way for each received CCIe word. Then the transmitter device may send the receiver device a CCIe checksum word with the most recent checksum value which the receiver device can compare to its own checksum value to ascertain whether any symbol errors occurred.

A checksum word 3005 can follow any CCIe word including: (a) CHK word (repeating CHK words) and/or (b) Heartbeat/SYNC word. A CCIe transmitter and receiver may support checksum functionality. For instance, the CCIe transmitter may send a checksum word 3005 which the CCIe receiver then use If a receiver device detects a checksum (CHK) error: (a) it may suspend CCIe actions (e.g. register writes) until SYNC word or WAKEUP event, (b) it may report the CHK error via an IRQ, (c) it may set a CHK error event in a status register, and/or (d) it may ignore the checksum error.

A checksum (CHK) word can be inserted at any word boundary. This makes the use of checksums easily portable within different systems/protocols and also a scalable data quality (e.g., use more CHKs over less reliable bus).

In some implementations, checksum (CHK) support may not be mandatory. This creates less of a burden for low tier products and also allows for a smooth depreciation if the use of checksums is not required.

Second Exemplary Approach to Error Detection

Detecting symbol errors in words having the format illustrated in FIGS. 29-31 is not always reliable and may be problematic for some systems. In bus systems requiring high data integrity, for example, such as medical, automobile, aerospace, or military use, it is often desirable to detect all symbol errors right away. To address this issue, an alternative CCIe word format is disclosed, wherein 100% symbol error detection is attainable (i.e., single symbol error per word without symbol slip). To this end, it should first be noted that aspects disclosed herein rely, in part, on the observations in FIGS. 23-28 in which 100% symbol error detection can be attained when encoded words are transmitted with their three least significant bits (LSBs) all fixed with known constants. However, utilizing the 3 LSBs to represent an error bit detection constant requires that the 3 LSBs be flexible so that their bit value can be controlled.

In the CCIe checksum word 3005 in FIG. 30, for example, bits 1 and 2 are allocated to the control code for the CCIe word. Such control codes identify whether a word contains a read or write operation and cannot be modified without affecting operation of the CCIe word.

One solution is to modify the CCIe word format illustrated in FIG. 30 so that the 3 LSBs can represent a 3-bit error detection constant. An example of such modification is provided in FIGS. 13-15, which implements a flexible bit allocation scheme that can optimize data throughput or error detection, as desired.

FIG. 32 illustrates an exemplary flexible CCIe word format 3202 which facilitates error detection. In this 20-bit word 3202, bit [0] is allocated for an error detection constant 3204; bits [2,1] are allocated for either data or expanding the error detection constant 3206; bits [4,3] are allocated for the control bits 3208; bits [18,5] are allocated for a 14-bit data field 3210; and bit [19] is allocated for the aforementioned "extra" bit 3212. Namely, relative to an alternative CCIe word format 3220 in which bits [2,1] may be used for a control code 3228 that cannot be used for error correction, the flexible CCIe word 3202 moves the two control bits away from bits [2,1], which provides the flexibility of utilizing bits [2,1] for data to optimize data throughput (i.e., by allocating 16 bits for data via bits [18,5] and bits [2,1]) or for an error detection constant expansion to optimize error detection (i.e., by allocating the 3 LSBs for the error detection constant to attain the aforementioned 100% error detection). Users may thus choose between sending encoded words having 16 bits of data with non-100% symbol error detection, or sending encoded words having 14 bits of data with 100% symbol error detection, as desired.

It should be noted that any of various bit allocation schemes are contemplated to fall within the scope of aspects disclosed herein. For instance, although FIG. 32 illustrates an allocation of bits [4,3] for control bits in order to allocate them closer to the LSBs for this particular example (i.e., rather than allocating them closer to the higher valued MSBs), other bit allocation schemes may include placing these control bits in any combination of bits within bits [18,3]. It should also be noted that, although FIG. 32 illustrates a 20-bit CCIe word format, bit allocation schemes are similarly contemplated for words of any bit length, wherein the fixed number of least significant bits allocated for data or error detection constant expansion may be increased/decreased, as appropriate.

Furthermore, the aspects disclosed herein may facilitate dynamically switching between a first bit allocation scheme and a second bit allocation scheme, wherein the first bit allocation scheme is directed towards a data optimization (i.e., allocation of 16 bits for data), and wherein the second bit allocation scheme is directed towards an error detection optimization (i.e., allocation of 3 LSBs for error detection constant).

Exemplary Clock/Symbol Slip Error Detection

Symbol slip error caused by clock miss or extra clock may not be detected by an error detection constant and/or a checksum. However, the majority of these types of errors can be detected at the next word and/or using a state machine at the receiver device.

FIG. 35 illustrates an exemplary CCIe word transmission with no clock errors. Using a shared bus comprising a first line (SDA) 3502 and a second line (SCL) 3504, twelve symbols 3512 (making up a CCIe word) are transmitted between Start conditions 3508 and 3510. Such Start conditions 3508 and 3510 occur on a high-to-low transition on the first line (SDA) 3502 while the second line (SCL) 3504 is high. All CCIe-complaint devices understand this to be a Start condition (i.e., high-to-low transition on the first line (SDA) 3502 while the second line (SCL) 3504 is high) at expected CCIe word boundaries which may be tracked by a state machine of the receiver device. Additionally, a clock 3506 embedded within symbol-to-symbol transitions is also illustrated.

FIG. 36 illustrates an exemplary CCIe word transmission with a single clock miss error. That is, in this example a clock pulse 3602 was not detected by the receiver device, which causes a corresponding symbol "2" to be ignored. This condition 3604 may be referred to a symbol slip. Because the receiver device missed a clock, it will continue to read symbols from the first and second lines 3502 and 3504 and interpret the second start condition 3510 as a symbol and will expect the next symbol 3602 to be the Start condition. It is at this point that the clock miss error is detected by the receiver device since that next symbol 3602 will never by a Start condition. The receiver device may then assume a synchronization loss and reset its receiver logic.

FIG. 37 illustrates an exemplary CCIe word transmission with a double miss clock error. That is, in this example two clock pulses 3702 are not detected by the receiver device, which causes symbols "2" and "3" 3704 to be ignored. This condition may be referred to a double symbol slip. Because the receiver device missed two clocks, it will continue to read symbols from the first and second lines 3502 and 3504 and interpret the second start condition 3510 as a symbol. For 8 in 9 cases, the receiver device logic will recognize that the expected Start condition is missing (between the first and second symbols of the next word 3702) thus detecting the double could miss. The receiver device may include state machine logic to keep track of when a Start condition is expected. For the 1 in 9 chance that the transition between the first and second symbols of the next word 3702 will be detected as a Start condition (i.e., a 3 to 1 symbol transition), the receiver device may detect this double clock error on the next word (i.e., at some point in the next CCIe word, the transition between a first symbol and a second symbol will not be a Start condition and the error is detected by the receiver device).

FIG. 38 illustrates an exemplary CCIe word transmission with an extra clock error. That is, in this example an extra clock pulse 3802 was detected by the receiver device, which causes an extra symbol "1" to be read. Under this condition 3804, the receiver device will expect the next start condition during the last valid symbol transition 3806. In 8 of 9 cases, the combination of symbols in the last two symbols of the CCIe word will not result in a Start condition, so the receiver device will recognize a synchronization error. In 1 of 9 cases, the last two symbols of the CCIe word will be recognized by the receiver device as a Start condition (i.e., a 3 to 1 symbol transition). For that situation, the receiver device may rely on the error detection constant of the current and/or next CCIe word to detect this error.

Exemplary Device with Flexible Error Detection

FIG. 33, a block diagram illustrating exemplary components of a master/slave device is provided in accordance with the disclosure. As illustrated, a master/slave device 3314 is coupled to a master/slave device 3360 via a control data bus 3350. Here, it is contemplated that either master/slave device 3314 or master/slave device 3360 may operate as a master or slave in accordance with the aforementioned aspects disclosed herein, and that master/slave device 3314 and master/slave device 3360 may have substantially similar components.

In this example, the master/slave device 3314 may be implemented with an internal bus architecture, represented generally by the bus 3302. The bus 3302 may include any number of interconnecting busses and bridges depending on the specific application of the master/slave device 3314 and the overall design constraints. The bus 3302 links together various circuits including one or more processors (represented generally by the processing circuit 3304), a memory 3305, and computer-readable media (represented generally by the computer-readable medium 3306). The bus 3302 may also link various other circuits such as timing sources, peripherals, voltage regulators, and power management circuits, which are well known in the art, and therefore, will not be described any further. A bus interface/circuit 3308 provides an interface between the control data bus 3350 and the master/slave device 3314.

In an aspect of the disclosure, computer-readable medium 3306 is configured to include various instructions 3306a, 3306b, and/or 3306c to facilitate CCIe protocol communications as disclosed herein. In a similar aspect, such communications can instead be implemented via hardware by coupling processing circuit 3304 to any of circuits 3320, 3330, and/or 3340, as shown. Alternatively, the processing circuit 3304 may include and/or implement any of circuits 3320, 3330, and/or 3340. Moreover, it is contemplated that CCIe communications may be facilitated by any combination of instructions 3306a, 3306b, and/or 3306c, as well as any combination of circuits 3320, 3330, and/or 3340.

For instance, encoder/decoder instructions 3306a and encoder/decoder circuit 3320 are directed towards encoding/decoding words according to a CCIe protocol. As previously mentioned (see FIGS. 2-21), such encoding/decoding may comprise converting a ternary number into a plurality of symbols on a digit by digit basis (e.g., a twelve digit ternary number results in twelve symbols) to yield the aforementioned "extra bit" (bit 19).

In another aspect of the disclosure, error detection instructions 3306b and error detection circuit 3330 are directed towards performing error detection as described and illustrated in FIGS. 23-32 and/or in accordance with a desired CCIe word format. To this end, as in FIGS. 31-32, a contemplated CCIe word format disclosed herein comprises encoded 20-bit words, wherein the three least significant bits are allocated for data or error detection. Moreover, it is contemplated that either of error detection instructions 3306b and/or error detection circuit 3330 may be configured to the facilitate a flexible bit allocation, wherein a least significant bit is allocated for error detection, and wherein each of a second least significant bit and a third least significant bit are allocated for either data or error detection. It further contemplated, as in FIGS. 23-30 and 35-38, that either of error detection instructions 3306b and/or error detection circuit 3330 may be configured to the facilitate error detection by use of a fixed least significant bit and/or in conjunction with a checksum word being added to the protocol, and/or by use of a receiver device logic that detects a missing Start condition.

In another aspect of the disclosure, checksum instructions 3306c and/or a checksum circuit 3340 may be configured to generate a checksum for words received and/or transmitted from the bus 3350. In particular, either of the checksum instructions 3306c and/or checksum circuit 3340 may be configured to facilitate a checksum calculations to support a CCIe checksum word.

It should be appreciated that the processing circuit 3304 is responsible for managing the bus 3302 (i.e., when the device 3314 is a master device) and general processing, including the execution of software stored on the computer-readable medium 3306. The software, when executed by the processing circuit 3304, causes the master/slave device 3314 to perform the various functions described below for any particular apparatus. The computer-readable medium 3306 may also be used for storing data that is manipulated by the processing circuit 3304 when executing software.

One or more processors in the processing circuit 3304 may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 3306. The computer-readable medium 3306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 3306 may reside in the master/slave device 3314, external to the master/slave device 3314, or distributed across multiple entities including the master/slave device 3314. The computer-readable medium 3306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

FIG. 34 illustrates an exemplary method that facilitates communication in accordance with one or more error detection features of a protocol (e.g., CCIe protocol). A plurality of bits to be transmitted over a shared bus are obtained, where either the 3 least significant bits or the least significant in the plurality of bits can be used for error detection 3402. The plurality of bits are converted into a ternary number 3404. Digits of the ternary number are converted into sequential symbols, where a clock is embedded within symbol-to-symbol transitions 3406. A plurality of symbols are combine into a word for transmission 3408. The word may then be transmitted over the shared bus to a receiving device 3410. Additionally, a checksum may be computed for the transmitted bits 3412. The checksum for the transmitted bits may be sent to the receiving device 3414.

According to one aspect, a transmitter device is provided comprising a bus interface and a processing circuit. The bus interface may serve to couple the transmitter device to a shared bus (to which receiving or slave devices are coupled). The transmitter device may manage or control communications over the shared bus. The processing circuit may be configured to: (a) obtain plurality of bits to be transmitted over a shared bus, where either the 3 least significant bits or the least significant in the plurality of bits are used for error detection; (b) convert the plurality of bits are into a ternary number; (c) convert digits of the ternary number into sequential symbols; (d) combine a plurality of symbols are into a word for transmission; and/or (e) transmit the word over the shared bus to a receiving device. A clock may be embedded within symbol-to-symbol transitions. The shared bus may be a two-line bus and both lines of the two-line bus are used to transfer the symbols. The processing circuit may be further configured to: (a) compute a checksum for the transmitted bits; and/or (b) transmit the checksum for the transmitted bits to the receiving device. The checksum may be inserted within any arbitrary word for transmission to the receiving device.

According to another aspect, a receiver device is provided comprising: a bus interface and a processing circuit. The bus interface may serve to couple to a shared bus on which communications are managed by a master device. The processing circuit may be configured to: (a) receive a plurality of symbols over the shared bus; (b) convert the plurality of symbols into digits; (c) combine the digits into a ternary number; (d) convert the ternary number into bits, where either the 3 least significant bits or the least significant in the plurality of bits are used for error detection; and/or (e) ascertain an error within the received plurality of bits based on either the 3 least significant bits or the least significant in the plurality of bits. A clock may be embedded within symbol-to-symbol transitions of the plurality of received symbols. The shared bus may be a two-line bus and both lines of the two-line bus are used to transfer the symbols. The receiver device may implement a state machine logic circuit that detects erroneous clock pulse misses and an erroneous extra clock pulses in the clock signal.

One or more of the components, steps, features, and/or functions illustrated in the Figures may be rearranged and/or combined into a single component, step, feature, or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

In addition, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices, and/or other machine readable mediums for storing information. The term "machine readable medium" includes, but is not limited to portable or fixed storage devices, optical storage devices, wireless channels and various other mediums capable of storing, containing, or carrying instruction(s) and/or data.

Furthermore, embodiments may be implemented by hardware, software, firmware, middleware, microcode, or any combination thereof. When implemented in software, firmware, middleware, or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a shared bus;
   a slave device coupled to the shared bus;
   a master device coupled to the shared data bus and adapted to manage communications on the shared bus; and
   wherein transmissions from at least one of the slave device or the master device over the shared bus are a plurality of bits that are encoded by the least one of the slave device or the master device into ternary numbers which are then transcoded into symbols for transmission, and either the 3 least significant bits or the least significant bit in the plurality of bits are used for error detection of the transmission, wherein the transcoding from ternary numbers to symbols includes obtaining a current sequential symbol based on a previous sequential symbol and a function of a current transition number, wherein the current transition number is an individual digit of a ternary number.

2. The device of claim 1, wherein the shared bus is a two-line bus and both lines of the two-line bus are used to transfer the symbols.

3. The device of claim 1, wherein a clock signal is embedded within symbol-to-symbol transitions.

4. The device of claim 3, wherein the slave device implements a state machine logic circuit that detects erroneous clock pulse misses and an erroneous extra clock pulses in the clock signal.

5. The device of claim 1, wherein the plurality of bits is a twenty-bit sequence.

6. The device of claim 5, wherein use of the 3 least significant bits for error detection guarantees detection of an error in the whole twenty-bit sequence.

7. The device of claim 6, wherein when the 3 least significant bits are used for error detection, the value of the 3 least significant bits set to a constant binary value of either "000" or "111".

8. The device of claim 5, wherein use of the second and third least significant bits is flexibly allocated to either data transmissions or error detection.

9. The device of claim 8, wherein use of the least significant bit for error detection guarantees detection of a single-symbol error in the whole twenty-bit sequence only fifty percent of the time.

10. The device of claim 1, wherein when only the least significant bit is used for error detection, the value of the least significant bit is set to a constant binary value of either "1" or "0".

11. A method operational on a transmitter device, comprising:
    obtaining a plurality of bits to be transmitted over a shared bus, where either the 3 least significant bits or the least significant bit in the plurality of bits are used for error detection;
    converting the plurality of bits into a ternary number;
    converting digits of the ternary number into sequential symbols, wherein the converting of digits of the ternary number into sequential symbols includes obtaining a current sequential symbol based on a previous sequential symbol and a function of a current transition number, wherein the current transition number is an individual digit of the ternary number;
    combining a plurality of symbols are into a word for transmission; and
    transmitting the word over the shared bus to a receiving master or slave device.

12. The method of claim 11, further comprising:
    computing a checksum for the transmitted bits; and
    transmitting the checksum for the transmitted bits to the receiving master or slave device.

13. The method of claim 12, wherein the checksum is inserted within any arbitrary word for transmission to the receiving master or slave device.

14. The method of claim 11, wherein a clock is embedded within symbol-to-symbol transitions.

15. The method of claim 11, wherein the shared bus is a two-line bus and both lines of the two-line bus are used to transfer the symbols.

16. A transmitter device, comprising:
    a bus interface to couple to a shared bus;
    a processing circuit coupled to the bus interface and configured to:
    obtain a plurality of bits to be transmitted over a shared bus, where either the 3 least significant bits or the least significant bit in the plurality of bits are used for error detection;
    convert the plurality of bits are into a ternary number;
    convert digits of the ternary number into sequential symbols, wherein the converting of digits of the ternary number into sequential symbols includes obtaining a current sequential symbol based on a previous sequential symbol and a function of a current transition number, wherein the current transition number is an individual digit of the ternary number;
    combine a plurality of symbols into a word for transmission; and
    transmit the word over the shared bus to a receiving master or slave device.

17. The device of claim 16, wherein the processing circuit is further configured to:
    compute a checksum for the transmitted bits; and
    transmit the checksum for the transmitted bits to the receiving master or slave device.

18. The device of claim 17, wherein the checksum is inserted within any arbitrary word for transmission to the receiving master or slave device.

19. The device of claim 16, wherein a clock is embedded within symbol-to-symbol transitions.

20. The device of claim 16, wherein the shared bus is a two-line bus and both lines of the two-line bus are used to transfer the symbols.

21. A receiver device, comprising:
a bus interface to couple to a shared bus;
a processing circuit coupled to the bus interface and configured to:
receive a plurality of symbols over the shared bus;
convert the plurality of symbols into digits, wherein the converting of the plurality of symbols into digits includes obtaining a current transition number based on a function of a current sequential symbol and a previous sequential symbol, and wherein the current transition number is an individual digit of a ternary number;
combine the digits into the ternary number;
convert the ternary number into bits, where either the 3 least significant bits or the least significant bit in the plurality of bits are used for error detection; and
ascertain an error within the received plurality of bits based on either the 3 least significant bits or the least significant bit in the plurality of bits.

22. The receiver device of claim 21, wherein a clock is embedded within symbol-to-symbol transitions of the plurality of received symbols.

23. The receiver device of claim 21, further comprising:
a state machine logic circuit that detects erroneous clock pulse misses and an erroneous extra clock pulses in the clock signal.

24. The receiver device of claim 21, wherein the shared bus is a two-line bus and both lines of the two-line bus are used to transfer the symbols.

* * * * *